United States Patent
Wang et al.

(10) Patent No.: US 7,400,665 B2
(45) Date of Patent: Jul. 15, 2008

(54) NANO-VCSEL DEVICE AND FABRICATION THEREOF USING NANO-COLONNADES

(75) Inventors: Shih-Yuan Wang, Palo Alto, CA (US); M. Saif Islam, Sacramento, CA (US); Raymond G. Beausoleil, Redmond, WA (US)

(73) Assignee: Hewlett-Packard Developement Company, L.P., Houston, TX (US)

( * ) Notice: Subject to any disclaimer, the term of this patent is extended or adjusted under 35 U.S.C. 154(b) by 373 days.

(21) Appl. No.: 11/084,886

(22) Filed: Mar. 21, 2005

(65) Prior Publication Data

US 2006/0098705 A1    May 11, 2006

Related U.S. Application Data

(63) Continuation-in-part of application No. 10/982,051, filed on Nov. 5, 2004, now Pat. No. 7,307,271.

(51) Int. Cl.
*H01S 5/183* (2006.01)
(52) U.S. Cl. .............. 372/50.124; 372/50.12; 977/951
(58) Field of Classification Search .......... 372/50.12, 372/50.124; 977/951
See application file for complete search history.

(56) References Cited

U.S. PATENT DOCUMENTS

| 5,115,441 | A * | 5/1992 | Kopf et al. ............... 372/45.01 |
| 6,297,063 | B1 | 10/2001 | Brown et al. |
| 6,611,546 | B1 * | 8/2003 | Garnache et al. ............. 372/92 |
| 6,714,574 | B2 * | 3/2004 | Clayton et al. ............ 372/50.1 |
| 6,737,939 | B2 | 5/2004 | Hoppe et al. |
| 6,755,956 | B2 | 6/2004 | Lee et al. |
| 6,996,147 | B2 * | 2/2006 | Majumdar et al. ....... 372/43.01 |
| 7,132,677 | B2 * | 11/2006 | Kim et al. ................ 257/14 |
| 7,254,151 | B2 * | 8/2007 | Lieber et al. ............ 372/44.01 |
| 2004/0023253 | A1 | 2/2004 | Kunwar et al. |
| 2004/0075464 | A1 | 4/2004 | Samuelson et al. |
| 2004/0131101 | A1 * | 7/2004 | Albrecht ................ 372/70 |
| 2005/0006673 | A1 | 1/2005 | Samuelson et al. |
| 2005/0164432 | A1 | 7/2005 | Lieber et al. |

OTHER PUBLICATIONS

Michael R.T. Tan et al., Surface Emitting Laser for Multimode Data Link Applications, Hewlett-Packard Journal, Feb. 1995, pp. 67-71. Hewlett-Packard Company.

(Continued)

*Primary Examiner*—Minsun Harvey
*Assistant Examiner*—Michael Carter

(57) ABSTRACT

A nano-colonnade VCSEL device and a method of fabrication utilize a nanowire column grown nearly vertically from a (111) horizontal surface of a first layer to another horizontal surface of a second layer to connect the layers. The VCSEL device includes a first layer having the (111) horizontal surface; a second layer; and an insulator support between the first layer and the second layer that separates the first layer from the second layer. A portion of the second layer overhangs the insulator support, such that a horizontal surface of the overhanging portion is spaced from and faces the (111) horizontal surface of the first layer. The VCSEL device further includes a nanowire column extending nearly vertically from the (111) horizontal surface to the facing horizontal surface, and distributed Bragg mirrors adjacent to opposite end of the nanowire column.

41 Claims, 4 Drawing Sheets

OTHER PUBLICATIONS

Ekmel Ozbay et al., Fabrication of High-Speed Resonant Cavity Enhanced Schottky Photodiodes, IEEE Photonics Technology Letters, May 1997, pp. 672-674, vol. 9, No. 5, IEEE.

Aram Moorandian, Pump Up The Power, SPIE's OE Magazine, Apr. 2002, pp. 30-33, SPIE.

Burghard Schneider, Oxide-confined VCSELs for 10 gigabit Ethernet, SPIE's OE Magazine, Apr. 2002, p. 33, SPIE.

K. Haraguchi et al., Self-organized fabrication of planar GaAs nanowhisker arrays, Appl. Phys. Lett., Jul. 15, 1996, pp. 386-387, vol. 69, No. 3, American Institute of Physics.

T. Shimada et al., Size, position and direction control on GaAs and InAs nanowhisker growth, Superlattices and Microstructures, 1998, pp. 453-458, vol. 24, No. 6, Acad. Press.

K. Haraguchi et al., Growth mechanism of planar-type GaAs nanowhiskers, J. Vac. Sci. Technol. B, Sep./Oct. 1997, pp. 1685-1687, vol. 15, No. 5, Amer. Vac. Soc.

A. Tilke et al., Coulomb blockade in quasimetallic silicon-on-insulator nanowires, Applied Physics Letters, Dec. 6, 1999, pp. 3704-3706, vol. 75, No. 23. Amer. Inst. of Physics.

A. Tilke et al., Quantum intererence in a one-dimensional silicon naowire, Physical Review B, 2003, pp. 075311-1 to 075311-6, vol. 68, 075311, Amer. Phys. Society.

Yi Cui and Charles M. Lieber, Functional Nanoscale Electronic Devices Assembled Using Silicon Nanowire-Building Blocks, Science, Feb. 2, 2001, pp. 851-853, vol. 291.

Zhiliang Yuan et al., Electrically Driven Single-Photon Source, Science, Jan. 4, 2002, pp. 102-105, vol. 295.

Charles Santori et al., Triggered Single Photons from a Quantum Dot, Physical Review Letters, Feb. 19, 2001, pp. 1502-1505, vol. 86, No. 8, The American Physical Society.

Thomas Martensson et al., Epitaxial III-V Nanowires on Silicon, Nano Letters, 2004, pp. 1987-1990, vol. 4, No. 10, The American Chemical Society.

S. D. Barrett et al., A symmetry analyzer for non-destructive Bell state detection using EIT, <http://arxiv.org/abs/quant-ph/0408117>.

R. G. Beausoleil et al., Applications of coherent population transfer to quantum information processing, Journal of Modern Optics, Jul. 20, 2004, pp. 1559-1601, vol. 51, No. 11.

Nicolas Gisin et al., Quantum cryptography, Reviews of Modern Physics, Jan. 2002, pp. 145-195, vol. 74, No. 1, the Amer. Physical Soc.

\* cited by examiner

NANO-VCSEL DEVICE AND FABRICATION THEREOF USING NANO-COLONNADES

CROSS-REFERENCE TO RELATED APPLICATIONS

This application is a continuation in part (CIP) of patent application of M. Saif Islam et al., Ser. No. 10/982,051, filed Nov. 5, 2004 now U.S. Pat. No. 7,307,271.

BACKGROUND

1. Technical Field

The invention relates to nanotechnology. In particular, the invention relates to nano-scale laser devices and their fabrication.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having at least one linear dimension between 1 nm and 200 nm. These nano-scale structures are often 50 to 100 times smaller than conventional semiconductor structures.

Nanowires are building blocks of many nano-scale devices, such as nano-scale field effect transistors (FETs), p-n diodes, light emitting diodes (LEDs) and nanowire sensors, to name a few. There are many techniques known in the art for growing or synthesizing nanowires. However, available techniques for interconnection of the nanowires with other circuit elements, such as between electrodes of a nano-scale device, tend to be tedious, expensive and sometimes not reproducible. For example, fabricated nanowires can be aligned or assembled using fluid flow and/or an electric field; and contacted to surfaces with e-beam lithography. As such, these techniques are limited to making contact to surfaces usually one nanowire (or one nanowire end) at a time. While these techniques are useful in a research environment and facilitate characterization studies using nanowires, they are not conducive to, and not suitable for, reproducible mass-fabrication of nano-scale devices, such as dense, low-cost device arrays, in a manufacturing environment.

Accordingly, it would be desirable to have an interconnection technique for nanowires that is conducive to a manufacturing environment of a variety of nano-scale devices. Such a technique would solve a long-standing need in the developing area of a "bottom-up" fabrication approach in nanotechnology.

BRIEF SUMMARY

In some embodiments of the present invention, a nano-colonnade vertical cavity surface emitting laser (VCSEL) device is provided. The nano-colonnade VCSEL device comprises a first layer having a (111) horizontal surface; a second layer; and an insulator support between the first layer and the second layer. The insulator support separates the first layer from the second layer. A portion of the second layer overhangs the insulator support, such that a horizontal surface of the overhanging portion is spaced from and faces the (111) horizontal surface of the first layer. The nano-colonnade VCSEL device further comprises a nanowire column extending nearly vertically from the (111) horizontal surface to the facing horizontal surface of the overhanging portion. The nano-colonnade VCSEL device further comprises distributed Bragg mirrors adjacent to opposite ends of the nanowire column.

In some embodiments of the present invention, a nano-colonnade VCSEL array device is provided. The nano-colonnade VCSEL array device comprises a first layer having a (111) horizontal surface; a second layer; and an insulator support between the first layer and the second layer. The insulator support separates the first layer from the second layer. The second layer has back-to-back portions that overhang the insulator support. A horizontal surface of the back-to-back overhanging portions is spaced from and faces the (111) horizontal surface of the first layer. The nano-colonnade VCSEL array device further comprises a nanowire column extending nearly vertically from the (111) horizontal surface to the facing horizontal surface of each overhanging portion. The nano-colonnade VCSEL array device further comprises distributed Bragg mirrors adjacent to opposite ends of the nanowire columns.

In some embodiments of the present invention, a nano-colonnade VCSEL device with an integral pump is provided. The nano-colonnade VCSEL device with an integral pump comprises a first layer having a (111) horizontal surface; a second layer; and an insulator support between the first layer and the second layer. The insulator support separates the first layer from the second layer. A portion of the second layer overhangs the insulator support, such that a horizontal surface of the overhanging portion is spaced from and faces the (111) horizontal surface of the first layer. The nano-colonnade VCSEL device with an integral pump further comprises a nanowire column extending nearly vertically from the (111) horizontal surface to the facing horizontal surface of the overhanging portion. The nanowire column comprises a quantum dot. The nano-colonnade VCSEL device with an integral pump further comprises distributed Bragg mirrors adjacent to opposite ends of the nanowire column. The nano-colonnade VCSEL device with an integral pump further comprises an optical pump on the first layer. The optical pump has an output directed at the nanowire column. The pump optically pumps the quantum dot.

In some embodiments of the present invention, a method of fabricating a nano-colonnade VCSEL device is provided. The method of fabricating comprises providing a wafer having a material that acts as an insulating layer sandwiched between a (111) horizontal surface of a first layer and a second layer. The method of fabricating further comprises etching the wafer to expose a section of the (111) horizontal surface and to cantilever a portion of the second layer over the exposed section. A section of the insulating layer supports the cantilevered portion. The method of fabricating further comprises growing a nanowire column from the exposed (111) horizontal surface to a facing horizontal surface of the cantilevered portion to bridge the first layer and the second layer. The method of fabricating further comprises forming distributed Bragg mirrors adjacent to opposite ends of the nanowire column to delineate a vertical optical cavity with the nanowire column.

Certain embodiments of the present invention have other features in addition to and/or in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the FIG. 1 illustrates a side view of a nano-colonnade VCSEL device according to an embodiment of the present invention.

DETAILED DESCRIPTION

Figure 1:
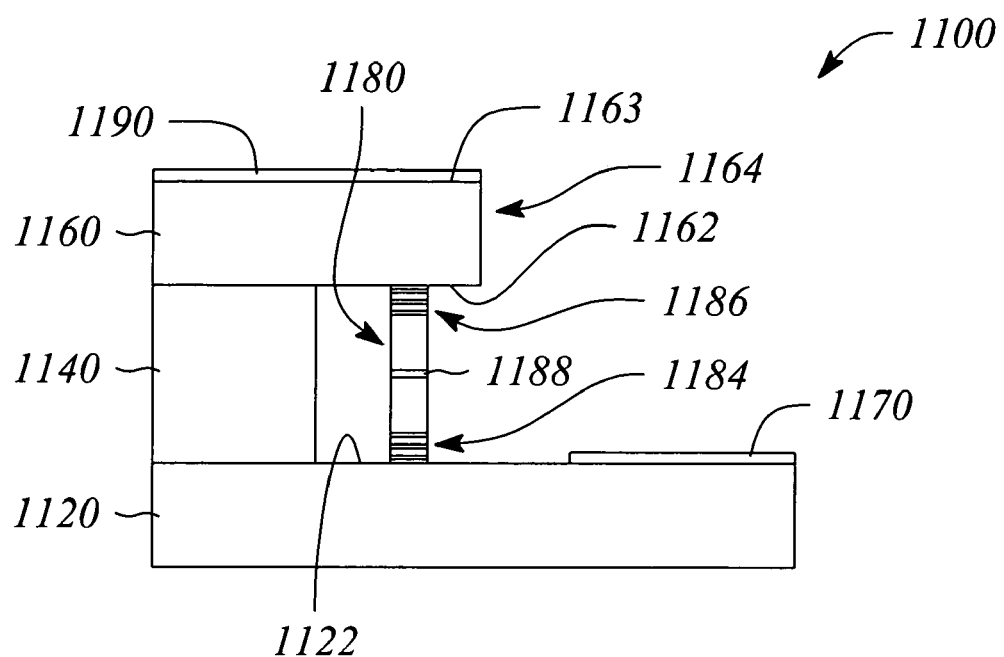

Embodiments of the present invention are directed to a nanowire grown to interconnect vertically spaced apart horizontal surfaces. The horizontal surface from which the nanowire grows is a (111) surface of a [111] oriented semiconductor crystal lattice. A semiconductor nanowire will grow preferentially nearly normal to the (111) surface. On a horizontally oriented (111) surface, the nanowire will grow from the (111) surface, as a column. The nanowire column growth may be akin to stalagmite growth in geology, for example and not by way of limitation. The nanowire column will grow nearly or substantially vertically at least until it contacts a facing horizontal surface. By 'nearly vertically' or 'substantially vertically' it is meant that the nanowire will grow from the (111) horizontal surface predominantly in a direction to connect to the facing horizontal surface. Once contacted, the nanowire column will attach or connect to the facing horizontal surface. The crystal orientation of the facing horizontal surface can be any orientation including, but not limited to, one of a [110], [111] and [100] crystal lattice orientation for nanowire attachment. Among other things, various embodiments of the present invention may provide a massively parallel, self-assembly technique for interconnecting nanowire columns between spaced apart horizontal surfaces. When the horizontal surfaces are surfaces of doped semiconductor layers, such as highly doped semiconductor layers, the grown semiconductor nanowire column forms a circuit connection between electrodes or an optical cavity of a laser device.

The use of brackets '[ ]' herein in conjunction with such numbers as '111', '110' and '100' pertains to a direction or orientation of a crystal lattice. The use of parenthesis '( )' herein with respect to such numbers '111', '110' and '100' pertains to a plane or a planar surface of a crystal lattice. Such use is intended to follow standard crystallographic nomenclature known in the art.

The semiconductor materials useful for the various embodiments of the present invention include, but are not limited to, group IV, group III-V and group II-VI semiconductor materials, including compound semiconductor materials, from the Periodic Table of the Elements. A first or growth-originating layer or substrate, from which a nanowire column is grown, is a semiconductor material from the groups listed above, or another semiconductor material, that forms a [111] crystal lattice, and therefore has a (111) horizontal surface. A second layer, to which the nanowire column is grown to connect, is a semiconductor material either from any of the groups listed above or another semiconductor material that has any crystal orientation, or a metal-semiconductor alloy material. An example of a metal-semiconductor alloy includes, but is not limited to, titanium-silicide ($TiSi_2$), for example. An insulator layer, which separates the first layer from the second layer, is any material that is capable of being made insulating including, but not limited to, a semiconductor material from the groups listed above, or another semiconductor material. Moreover, the insulating material may be an oxide or a nitride of any of those semiconductor materials, such that insulating properties of the material are facilitated. The first layer and the second layer may be doped semiconductors to impart a target amount of electrical conductivity or other characteristic for an intended purpose, such as being highly doped for electrode applications, for example. The insulator layer is typically undoped to ensure the insulating properties.

The nanowire column may be a semiconductor material either from any of the groups listed above, another semiconductor material, a metal-semiconductor alloy, or another material that can form an optical cavity of a laser. For example and not by way of limitation, the nanowire may be made from a semiconductor including, but not limited to, any of silicon (Si), germanium (Ge), silicon carbide (SiC), gallium arsenide (GaAs), gallium nitride (GaN), gallium phosphide (GaP), indium phosphide (InP), indium arsenide (InAs), aluminum nitride (AlN), zinc oxide (ZnO), indium oxide (InO), indium tin oxide (ITO) and cadmium sulfide (CdS), for example, or a metal-semiconductor alloy, such as those described above by way of example for the second layer. Numerous nanowire materials are known in the art. The scope of the various embodiments of the present invention is intended to include all such materials. In some embodiments, the nanowire column is a single crystal structure, while in other embodiments, the nanowire column may be an amorphous or multi-crystalline structure. The nanowire material is compatible with the materials of the first or growth-originating layer and the second layer for a respective intended application. In some embodiments, a semiconductor nanowire may be doped to impart a target amount of electrical conductivity or other property, depending on the application.

The semiconductor and other materials have characteristic properties that impart different electrical, quantum, chemical and/or physical results. A nanowire can be grown such that one or more of length, diameter, shape, direction of growth, and position of the nanowire are controlled in accordance with some embodiments of the present invention. The semiconductor materials used in the first layer and the second layer may include, but are not limited to, the list of nanowire materials from above, for example.

In some embodiments of the present invention, a vertical cavity surface emitting laser device having a nanowire column interconnection (nano-colonnade VCSEL) is provided. The optical or laser cavity of a surface emitting-type laser is formed by distributed Bragg reflectors that sandwich an active layer. As is known in the art, light is emitted from a surface emitting-type laser in a direction perpendicular to a plane of the substrate or wafer, as a result of having a vertical optical or laser cavity. In contrast, light is emitted in a direction of the plane of the substrate of an edge emitting-type laser, as a result of having a horizontal optical or laser cavity. See, for example, Michael R. T. Tan et al., "Surface Emitting Laser for Multimode Data Link Applications", *Hewlett-Packard Journal*, February 1995, pp. 67-71, incorporated herein by reference.

The distributed Bragg reflectors or mirrors of a VCSEL have several layers of partially reflective materials. The partially reflective materials are materials of differing compositions that impart different reflective properties. As such, the layers of a Bragg mirror will reflect one or more wavelengths of light or one or more narrow ranges of wavelengths of light back into the vertical laser cavity of the VCSEL. By reflecting one or more wavelengths or wavelength ranges of light back into the vertical laser cavity, an emission from the VCSEL of a light or a laser beam at a single wavelength or a narrow range of wavelengths is achievable.

Compared to edge-emitting lasers, VCSELs are more cost effective to manufacture and operate. For example, a VCSEL may be tested at the wafer stage because a VCSEL emits light from a 'surface' of its vertical laser cavity rather than an 'edge' of a horizontal laser cavity. Moreover, a VCSEL characteristically emits more light than an edge-emitting laser for the same electric current applied thereto, making the VCSEL more energy efficient. Furthermore, a VCSEL adapts better to an optical fiber because the VCSEL emits a light beam that is narrower and more round than an edge-emitting laser.

Figure 2:
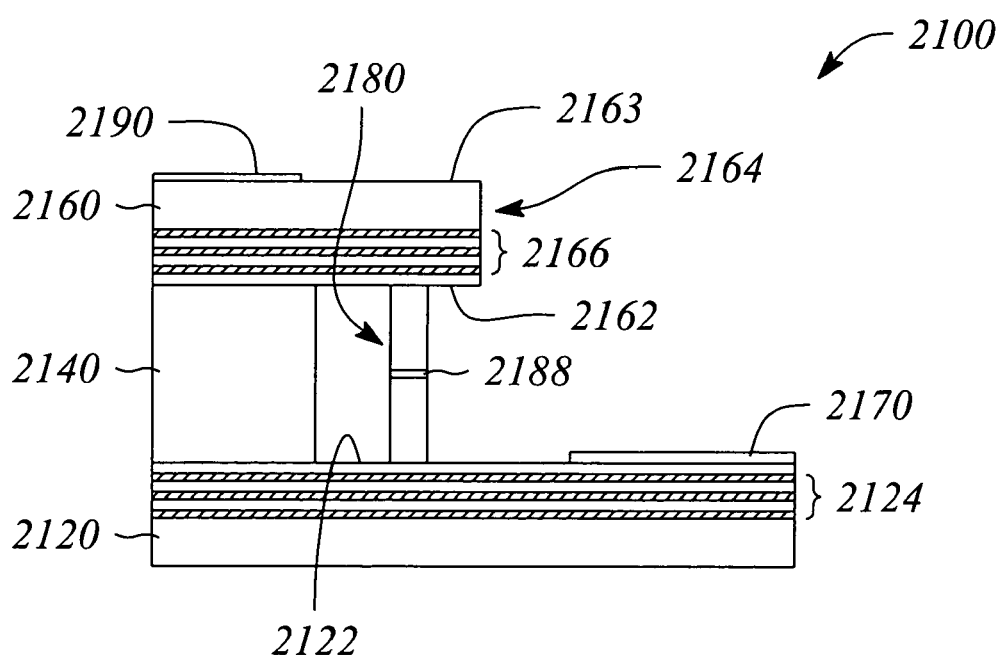
FIG. 2 illustrates a side view of a nano-colonnade VCSEL device according to another embodiment of the present invention.
Figure 3:
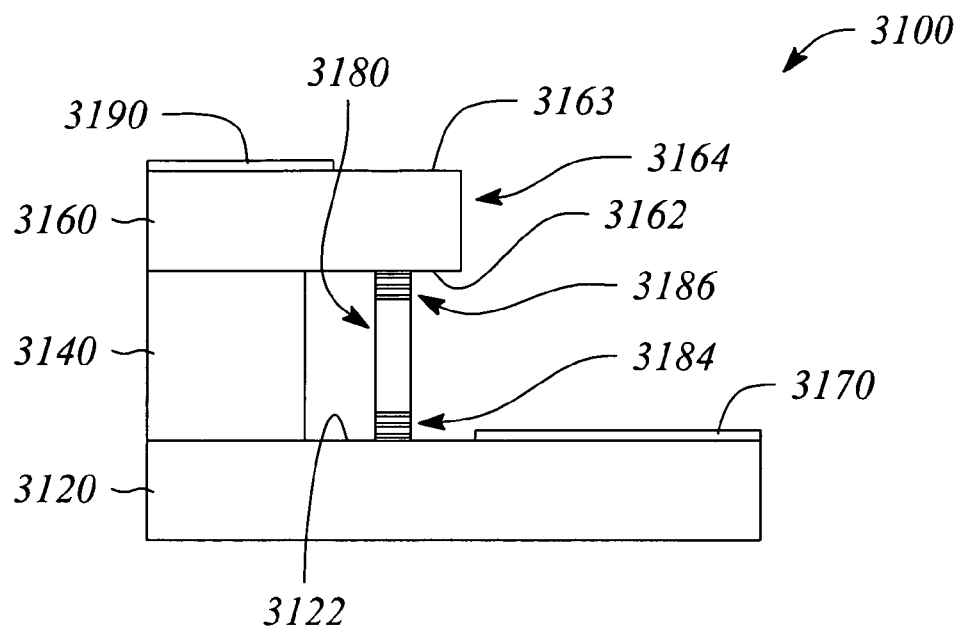
FIG. 3 illustrates a side view of a nano-colonnade VCSEL device according to another embodiment of the present invention.

FIG. 1 illustrates a side view of a nano-colonnade VCSEL device 1100 according to an embodiment of the present invention. FIG. 2 illustrates a side view of a nano-colonnade VCSEL device 2100 according to another embodiment of the present invention. FIG. 3 illustrates a side view of a nano-colonnade VCSEL device 3100 according to another embodiment of the present invention.

The nano-colonnade VCSEL devices 1100, 2100, 3100 comprise a first layer 1120, 2120, 3120 having a (111) horizontal surface 1122, 2122, 3122. The first layer has a [111] oriented semiconductor crystal lattice. The nano-colonnade VCSEL devices 1100, 2100, 3100 further comprise a second layer 1160, 2160, 3160 of a semiconductor material and an insulator layer support 1140, 2140, 3140 between the first layer 1120, 2120, 3120 and the second layer 1160, 2160, 3160. A portion 1164, 2164, 3164 of the second layer 1160, 2160, 3160 overhangs the insulator support 1140, 2140, 3140. Hereinafter, the portion of the second layer 1160, 2160, 3160 that overhangs the insulator support is referred to interchangeably as either the 'overhanging portion' or the 'cantilevered portion' 1164, 2164, 3164 without limitation herein. The cantilevered portion 1164, 2164, 3164 is essentially supported by the insulator support 1140, 2140, 3140. The second layer 1160, 2160, 3160, including the cantilevered portion 1164, 2164, 3164 thereof, has a horizontal surface 1162, 2162, 3162 that faces the (111) horizontal surface 1122, 2122, 3122 of the first layer 1120, 2120, 3120. The facing horizontal surface 1162, 2162, 3162 of the cantilevered portion 1164, 2164, 3164 is exposed to the (111) horizontal surface 1122, 2122, 3122 of the first layer 1120, 2120, 3120.

In some embodiments, the first semiconductor layer 1120, 2120, 3120 is lattice matched to the respective second semiconductor layer 1160, 2160, 3160. In some embodiments, the insulator support 1140, 2140, 3140 is lattice-matched to one or both of the first layer 1120, 2120, 3120 and the second layer 1160, 2160, 3160. Moreover in some embodiments, one or both of the first layer 1120, 2120, 3120 and the second layer 1160, 2160, 3160 are doped with one or both of a p-type dopant and an n-type dopant to impart respective target levels of electrical conductivity to the first and second layers. Techniques and materials for doping a semiconductor material are known and also are described in pending parent application, U.S. Ser. No. 10/982,051, cited supra, incorporated by reference herein.

The nano-colonnade VCSEL devices 1100, 2100, 3100 further comprise a nanowire column 1180, 2180, 3180 extending from the (111) horizontal surface 1122, 2122, 3122 of the first layer 1120, 2120, 3120 to the facing horizontal surface 1162, 2162, 3162 of the cantilevered portion 1164, 2164, 3164 of the second layer 1160, 2160, 3160. The nanowire column 1180, 2180, 3180 has a precise length defined by a thickness or height of the insulator layer support 1140, 2140, 3140, which represents a distance between the respective horizontal surfaces 1122 and 1162, 2122 and 2162, 3122 and 3162 of the first layer 1120, 2120, 3120 and the second layer 1160, 2160, 3160. In some embodiments, the nanowire column 1180, 2180, 3180 is lattice-matched to one or both of the respective first semiconductor layer 1120, 2120, 3120 and the respective second semiconductor layer 1160, 2160, 3160. In some embodiments, the nanowire column 1180, 2180, 3180 is further lattice-matched to the respective insulator layer or support 1140, 2140, 3140.

The nano-colonnade VCSEL devices 1100, 2100, 3100 further comprise means for delineating a vertical optical or laser cavity with the nanowire column 1180, 2180, 3180. In some embodiments, the means for delineating comprise distributed Bragg mirrors or reflectors adjacent to opposite ends of the nanowire column, as described further below. The distributed Bragg mirrors or reflectors are spaced apart to sandwich an active layer of the respective nano-colonnade VCSEL device, such as the nanowire column, to define or delineate the vertical laser cavity. As such, the nanowire column and the respective vertical optical or laser cavity formed therewith may be referred to hereinafter with the same reference numeral for simplicity (i.e., nanowire column 1180, 2180, 3180 and respective laser cavity 1180, 2180, 3180). Moreover, the embodiments of the nano-colonnade VCSEL devices 1100, 2100 further comprise means for producing single photon emissions. In some embodiments, the means for producing single photon emissions is a quantum dot (QD), as described further below. In these embodiments, the Bragg mirrors define a cavity around the QD to facilitate amplification of signals from the QD, such that the QD is more efficient relative to a QD without such a defined cavity.

A QD is characteristically used to generate single photons. Single photon generation may be useful for both low-light level classical nonlinear optics and quantum information processing. For example, in a classical optical switch, resonant nonlinear optical phenomena, such as electromagnetically induced transparency can be used to control classical optical bits (represented by 300-10,000 photons) using a single photon. See for example, R. G. Beausoleil, W. J. Munro, and T. P. Spiller, "Applications of coherent population transfer to quantum information processing (Topical Review)," *J. Mod. Opt.*, 51, 1559 (2004), incorporated herein by reference. Moreover, quantum key distribution relies on robust on-demand single photons as a core component. See for example, N. Gisin, G. Ribordy, W. Tittel, and H. Zbinden, "Quantum cryptography", Rev. Mod. Phys., 74, 145 (2002), incorporated herein by reference. In addition, nonlinear optical quantum information processing can be performed near-deterministically using single photons and coherent states. See for example, S. D. Barrett, P. Kok, K. Nemoto, R. G. Beausoleil, W. J. Munro, and T. P. Spiller, "A symmetry analyzer for non-destructive Bell state detection using EIT", *Phys. Rev.* A71, 060302 (2005), incorporated herein by reference.

The nano-colonnade VCSEL device 1100 embodiment illustrated in FIG. 1 comprises spaced apart distributed Bragg mirrors that are located on or in the nanowire column 1180. A first Bragg mirror 1184 is integrated in the nanowire column 1180 adjacent to a first end that is adjacent to the first layer 1120. A second Bragg mirror 1186 is integrated in the nanowire column 1180 adjacent to a second end that is adjacent to the second layer 1160. The Bragg mirrors 1184, 1186 are separated from each other and located in positions along the nanowire length. In some embodiments, one or both of the first Bragg mirror 1184 and the second Bragg mirror 1186 is introduced into the nanowire column 1180 during nanowire growth. Forming of Bragg reflector layers in a growing nanowire is described in pending parent application, U.S. Ser. No. 10/982,051, cited supra, incorporated by reference herein. The Bragg mirrors 1184, 1186 delineate opposite ends of a nanowire laser cavity 1180 of the VCSEL device 1100.

Each of the first and second Bragg mirrors 1184, 1186 comprises a plurality of distributed Bragg reflector layers. The Bragg reflector layers have an index of refraction that differs from the index of refraction of the semiconductor material of the nanowire column. In some embodiments, the Bragg mirrors 1184, 1186 are lattice matched to the nanowire column 1180. In some embodiments, the Bragg mirrors 1184, 1186 are lattice matched to one or more of the first semiconductor layer 1120, the second semiconductor layer 1160, the insulator layer support 1140, and the nanowire column 1180.

The nano-colonnade VCSEL device 2100 embodiment illustrated in FIG. 2 comprises spaced apart distributed Bragg mirrors that are located in or on the first semiconductor layer 2120 and the second semiconductor layer 2160, respectively, instead of in or on the nanowire column 2180. A first Bragg mirror 2124 is integrated in the first semiconductor layer 2120 adjacent to the (111) horizontal surface 2122 that is adjacent to a first end of the nanowire column 2180. A second Bragg mirror 2166 is integrated in the second semiconductor layer 2160 adjacent to the facing horizontal surface 2162 that is adjacent to a second end of the nanowire column 2180. Forming reflector layers of a Bragg mirror in a semiconductor layer is described in pending parent application, U.S. Ser. No. 10/982,051, cited supra, incorporated by reference herein. The cited parent application also provides a manufacturer of a semiconductor wafer having such Bragg mirrors incorporated therein. The first and second Bragg mirrors 2124, 2166 comprise a plurality of distributed Bragg reflector layers. In some embodiments, the Bragg mirrors 2124, 2166 are lattice matched to one or both of the first semiconductor layer 2120 and the second semiconductor layer 2160. In some embodiments, the Bragg mirrors 2124, 2166 are lattice matched to one or more of the first semiconductor layer 2120, the second semiconductor layer 2160, the nanowire column 2180 and the insulator layer 2140. The Bragg mirrors 2124, 2166 delineate opposite ends of a nanowire laser cavity 2180 of the VCSEL device 2100.

The nano-colonnade VCSEL devices 1100, 2100 further comprise a quantum dot (QD) 1188, 2188 located in or on the nanowire column 1180, 2180. In some embodiments, the nano-colonnade VCSEL device 1100, 2100 is a single photon light source or emitter 2100 that emits a single photon when triggered either electrically or optically by a pump pulse. Single photon light sources respond to a pulse pump by emitting a single photon with a probability approaching 1. See for example, Z. Yuan et al., "Electrically Driven Single-Photon Source", *Science*, 295, 102 (2002) and S. Santori et al., "Triggered Single Photons from a Quantum Dot", *Phys. Rev. Lett.*, 86, 1502 (2001), both incorporated herein by reference, for additional information about single photon light sources/ emitters. The single photon light source 2100 has applications in low-light level classical nonlinear optics and quantum information processing, such as those described above. The QD material has a band gap that is different from the band gap of the nanowire material. In some embodiments of the nano-colonnade VCSEL devices 1100, 2100, the QD 1188, 2188 is integrated into the nanowire column 1180, 2180 at a position along the nanowire length. The QD 1188 is essentially located between the spaced apart Bragg mirrors 1184 and 1186 of the nanowire column 1180 within the defined vertical optical cavity 1180. The QD 2188 is essentially located between the spaced apart Bragg mirrors 2124 and 2166 of the respective semiconductor layers 2120 and 2160 within the defined vertical optical cavity 2180. For example and not by way of limitation, the QD 1188, 2188 may be located at an approximate midpoint of the nanowire length. In some embodiments, the QD 1188, 2188 is introduced into the nanowire column 1180, 2180 during nanowire growth. Forming a QD in a nanowire column during nanowire growth is described in pending parent application, U.S. Ser. No. 10/982,051, cited supra, incorporated by reference herein.

The nano-colonnade VCSEL device 3100 illustrated in FIG. 3 further comprises distributed Bragg mirrors 3184, 3186 that are located in a spaced apart fashion along the length of the nanowire column 3180, similar to that described above for the nano-colonnade VCSEL device 1100, except that a QD structure is absent in the VCSEL device 3100. In some embodiments, the Bragg mirrors 3184, 3186 are introduced into the nanowire column 3180 during nanowire growth. The Bragg mirrors 3184, 3186 delineate opposite ends of a nanowire laser cavity 3180 of the VCSEL device 3100.

In some embodiments of the nano-colonnade VCSEL devices 1100, 2100, 3100, the nanowire column 1180, 2180, 3180 may have a heterojunction at an interface with a respective Bragg mirror 1184, 1186, 3184, 3186 and/or a respective QD 1188, 2188, depending on the embodiment. However, when the size of the material is so small (i.e., atomic or nanometer scale), such as in the case of nanowires, one can grow a Bragg mirror or a QD on the nanowire and essentially still have single crystal material.

In some embodiments of the nano-colonnade VCSEL devices 1100, 2100, the QD 1188, 2188 is independently a semiconductor material including, but not limited to, the group IV, the group III-V and the group II-VI semiconductors, for example and not by way of limitation, that has a band gap that differs from the band gap of the nanowire column. For example, a InP nanowire (having a high band gap) may be grown and while it is growing, a small amount of InGaAs (having a low band gap) may be added as a nanowire segment and thereafter, the InP nanowire growth is continued until the InP nanowire bridges to the facing horizontal surface. The InGaAs segment is a quantum dot integrated into the InP nanowire column in this example. In some embodiments, the QD 1188, 2188 may create cavities with three-dimensional photon confinement and discrete modes.

In some embodiments of the nano-colonnade VCSEL devices 1100, 3100, the Bragg mirrors 1184, 1186, 3184, 3186 comprise alternating layers of semiconductor materials having different indices of refraction from each other and/or from the semiconductor material of the respective nanowire column 1180, 3180. In some of these embodiments, the Bragg mirror alternating layers are independently a semiconductor material selected from the group IV, the group III-V and the group II-VI semiconductors, or another semiconductor material, for example and not by way of limitation. A Si nanowire, for example, may be grown and while it is growing, a small amount of a semiconductor material with a different index of refraction from Si including, but not limited to, Ge, Si—Ge alloy, InP and GaAs, for example, may be added as a reflector segment or layer to the Si nanowire. See for example, Martensson, T., Svensson, C. P. T., Wacaser, B. A., Larsson, M. W., Siefert, W., Deppert, K., Gustafsson, A., Wallenberg, L. R., & Samuelson, L., "Epitaxial III-V Nanowires on Silicon", *Nano Lett.*, (Communication), 2004, 4(10), 1987-1990, incorporated herein by reference. The added layer is repeated two or more times, with the Si nanowire growth continued in between each added layer, and then the Si nanowire growth is continued. Each added layer during nanowire growth alternates with the exemplary Si nanowire material. The added layers are reflector layers of a set of reflector layers of a Bragg mirror that is integrated into the Si nanowire column during nanowire growth in this example.

In some embodiments of the nano-colonnade VCSEL devices 1100, 3100, a first set of alternating nanowire reflector layers is introduced during nanowire growth while the nanowire is in an early stage of growth, such that a first Bragg mirror 1184, 3184 is formed in the nanowire column 1180, 3180 near or adjacent to a first end that is adjacent to the (111) horizontal surface 1122, 3122 of the first semiconductor layer 1120, 3120. Then a second set of alternating nanowire reflector layers is introduced during a later stage of the nanowire growth, such that a second Bragg mirror 1186, 3186 is formed in the nanowire column 1180, 3180 near or adjacent to a second end that is adjacent to the facing horizontal surface 1162, 3162 of the second semiconductor layer 1160, 3160. The first end of the nanowire column 1180, 3180 is opposite the second end.

For the nano-colonnade VCSEL device 1100, the QD 1188 also is introduced into the growing nanowire column 1180. The QD 1188 is introduced after the first Bragg mirror 1184 is incorporated, but before incorporating the second Bragg mirror 1186, such that the QD 1188 is spaced apart from and located between the first and second Bragg mirrors 1184, 1186 at a position along the nanowire length.

In some embodiments of the nano-colonnade VCSEL devices 1100, 2100, 3100, a respective Bragg reflector layer material further comprises a p-type or an n-type dopant. In some of these embodiments, a doped Bragg reflector layer may facilitate current biasing of a respective nanowire column. While doping the Bragg mirror may change a target reflectivity also, the change in reflectivity is very negligible with doping.

In some embodiments of the nano-colonnade VCSEL device 2100, the Bragg mirrors 2124, 2166 comprise alternating layers of semiconductor materials having different indices of refraction from each other and/or from the semiconductor material of the respective first and second semiconductor layers, into which the Bragg mirrors 2124, 2166 are integrated. In some of these embodiments, the Bragg mirror alternating layers are independently a semiconductor material including, but not limited to, the group IV, the group III-V and the group II-VI semiconductor materials, or another semiconductor material. For example and not by way of limitation, if the first and the second semiconductor layers 2120, 2160 are made of GaAs, at least one of the Bragg reflector layer materials incorporated therein has an index of refraction different from GaAs including, but not limited to, AlAs, InGaAs and InAlAs, in some embodiments. The AlAs, InGaAs and InAlAs are each lattice matched to GaAs. The exemplary GaAs semiconductor material of the semiconductor layers 2120, 2160 separates the two or more reflector layers of each Bragg mirror 2124, 2166 to produce reflector layers alternating with the exemplary GaAs material.

In some embodiments of the nano-colonnade VCSEL device 2100, the first semiconductor layer 2120, the second semiconductor layer 2160, the insulator layer support 2140 and the nanowire 2180 are lattice matched ones of a semiconductor material independently selected from the group III-V, such as InP, GaAs, AlGaAs, and InGaAs, for example and not by way of limitation. In some embodiments, the Bragg reflector materials are also from the group III-V, for example, and are lattice-matched to at least the first and second semiconductor layers 2120, 2160, but have a different index of refraction from each other and/or the first and second semiconductor layers 2120, 2160.

In some embodiments, the nano-colonnade VCSEL devices 1100, 2100, 3100 further comprise means for making electrical contact to opposite ends of the vertical optical or laser cavity (i.e., nanowire laser cavities 1180, 2180, 3180), such that the laser cavity may be electrically pumped with an electrical current or pulse. In some embodiments, the means for making electrical contact comprises one or both first and second semiconductor layers 1120, 1160, 2120, 2160 being highly doped. By 'highly doped' it is meant that a sufficient amount of a p-type and/or an n-type dopant, which are known in the art, is added to the semiconductor layer to achieve a target amount of electrical conductivity for making such electrical contact. In some embodiments, the means for making electrical contact comprises one or both of a first contact pad or electrode and a second contact pad or electrode on the first layer and the second layer, respectively, in addition to or in lieu of the highly doped first and second layers.

In some embodiments, a first contact pad 1170, 2170, 3170 is provided adjacent to or on the (111) horizontal surface 1122, 2122, 3122 of the first semiconductor layer 1120, 2120, 3120 to provide the electrical contact with a first end of the vertical optical cavity. The first contact pad 1170, 2170, 3170 is spaced apart from the nanowire column 1180, 2180, 3180 on the (111) horizontal surface 1122, 2122, 3122. In some embodiments, the first contact pad is located on the first semiconductor layer 1120, 2120, 3120 out from under the cantilevered portion 1164, 2164, 3164 of the second semiconductor layer 1160, 2160, 3160. In some embodiments, a second contact pad or electrode 1190, 2190, 3190 is provided adjacent to or on a horizontal surface 1163, 2163, 3163 of the second layer 1160, 2160, 3160 that is opposite to the facing horizontal surface 1162, 2162, 3162. The second contact pad extends over a portion of the second layer surface 1163, 2163, 3163 to provide the electrical contact with the second end of the vertical optical cavity. In some embodiments, the surface portion on which the second contact pad extends includes the cantilevered portion of the second layer.

FIGS. 1 and 3 illustrate the second contact pad 1190, 3190 that extends onto the cantilevered portion 1164, 3164 of the second layer 1160, 3160, by way of example only. In some of these embodiments, the second contact pad 1190 overlies an area of the surface aligned with the nanowire column 1180, as illustrated in FIG. 1, by way of example only. In another of these embodiments, the second contact pad 3190 may extend onto the cantilevered portion 3164, but does not overlie the area aligned over the nanowire column 3180, as illustrated in FIG. 3, by way of example only. In other embodiments, the surface portion on which the second contact pad extends does not include the cantilevered portion. FIG. 2 illustrates the second contact pad 2190 on the surface of the second layer 2160 that does not extend on to the cantilevered portion 2164, by way of example only. The position or extent of the second contact pad on the second layer surface 1163, 2163, 3163 is interchangeable among the embodiments herein. Moreover, any of the embodiments illustrated in FIGS. 1-3 may have the second contact pad extending differently on the surface of the second semiconductor layer than that illustrated and still be within the scope of the various embodiments.

The first and second contact pads or electrodes 1170 and 1190, 2170 and 2190, 3170 and 3190 comprise an electrically conductive material selected from a conductive metal, metal-semiconductor alloy and a highly doped semiconductor or nonmetal material. In some embodiments, the electrically conductive material is an optically transparent material, such as indium-tin-oxide (ITO). Metals, such as gold (Au), aluminum (Al), platinum (Pt), palladium (Pd), copper (Cu), nickel (Ni) and silver (Ag), for example, are examples of some conductive metals useful for the contact pads. A metal-semiconductor alloy, such as a metal-silicide alloy, including but not limited to, titanium-silicide, may be used to form a respective contact pad on silicon or silicon-on-insulator (SOI) wafers (first and/or second semiconductor layers). A conductive nonmetal material, such as a highly doped polysilicon, also may be used for the contact pad.

The first and second contact pads 1170, 1190, 2170, 2190, 3170, 3190 may be formed on the respective semiconductor layers of the nano-colonnade VCSEL devices 1100, 2100, 3100 using a deposition technique including, but not limited to, electron-beam evaporation, sputtering, evaporation, chemical vapor deposition, molecular beam epitaxy, self assembly monolayer (SAM) growth, or other selective or nonselective deposition techniques, and optionally using thermal annealing and using any available lithographic process for patterning, for example. Moreover, gold may be deposited on a respective first and/or second semiconductor layer of GaAs using a rapid thermal process and annealing. The above-mentioned deposition processes and materials are known to those skilled in the art. These techniques and other materials and processes, which are readily devised by the skilled artisan, are within the scope of the embodiments of the present invention.

Figure 4:
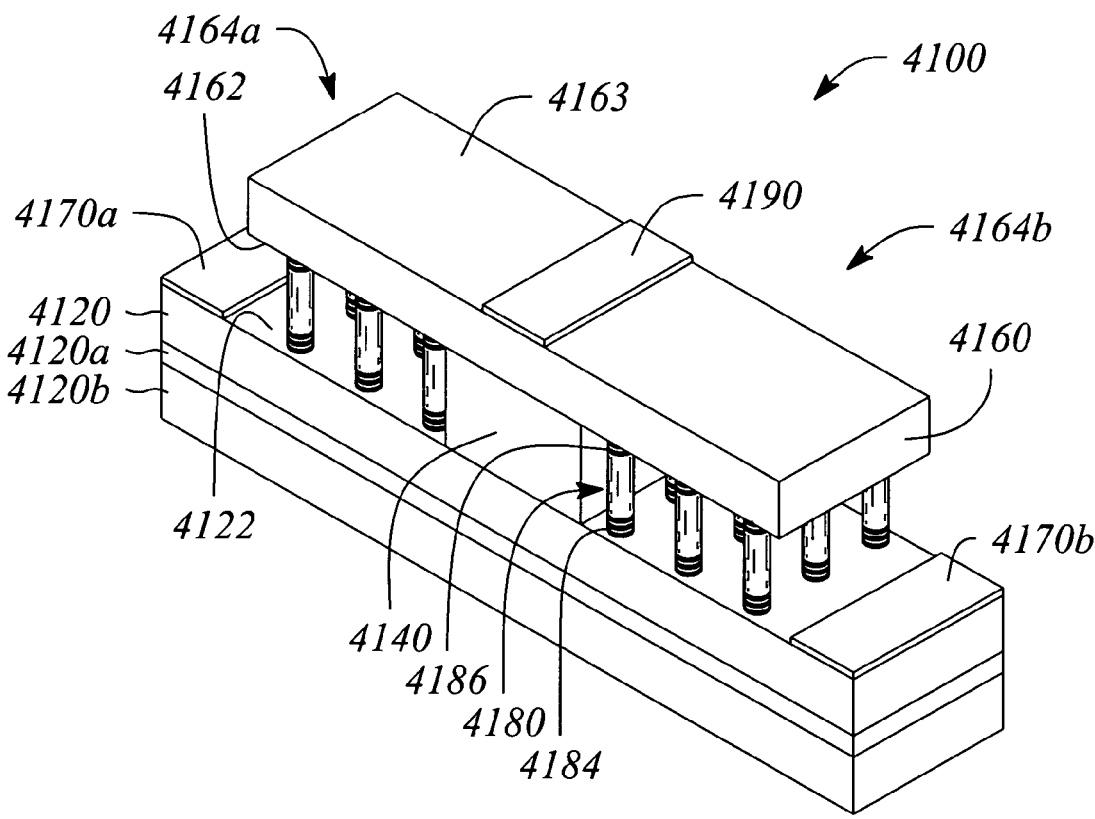
FIG. 4 illustrates a side view of a nano-colonnade VCSEL array device according to another embodiment of the present invention.
Figure 5:
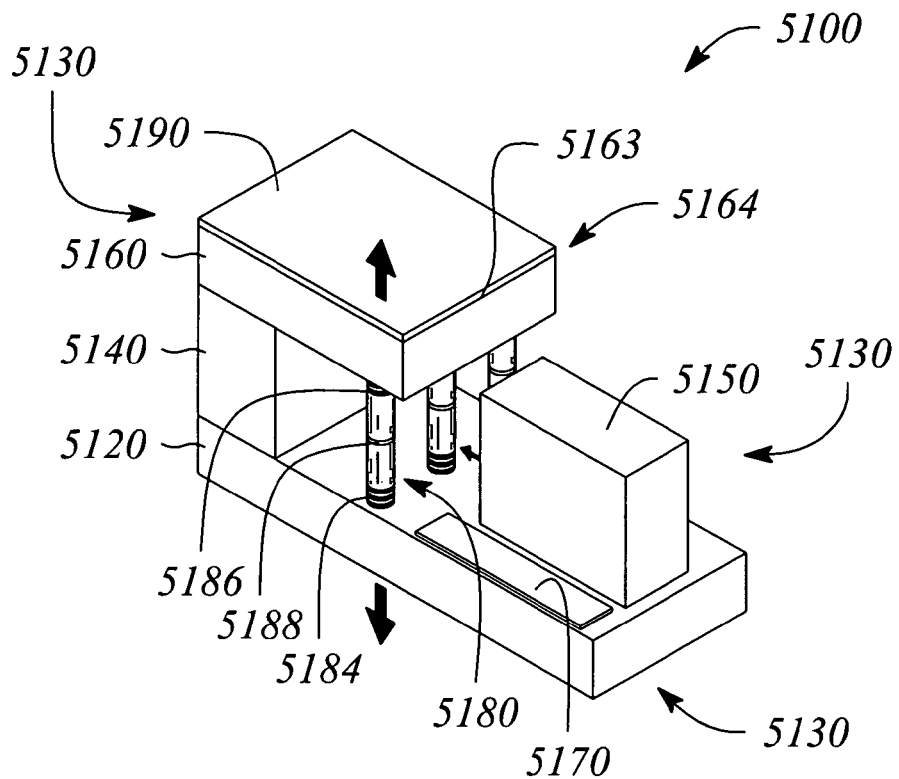
FIG. 5 illustrates a perspective view of a nano-colonnade VCSEL device with an integral pump according to another embodiment of the present invention.

While only one nanowire 1180, 2180, 3180 is visible in the side views of FIGS. 1-3, the nano-colonnade VCSEL devices 1100, 2100, 3100 may have a plurality of spaced apart nanowire columns that bridge the opposing respective surfaces 1122, 1162; 2122, 2162; 3122, 3162. FIGS. 4 and 5 illustrate perspective views that show a plurality of nanowire columns. Such illustrations are intended to provide support for embodiments of the nano-colonnade VCSEL devices 1100, 2100, 3100 that have a plurality of nanowire columns. In some embodiments of the nano-colonnade VCSEL devices 1100, 2100, 3100 that have a plurality of nanowire columns, a separate second contact pad 1190, 2190, 3190 may be provided for one or more nanowire columns of a set or group of nanowire columns of the plurality. In other such embodiments, a divided or partitioned second layer with corresponding cantilevered portions thereof may include spaced apart second contact pads for a single nanowire column or a set or group of nanowire columns of the plurality, and be within the scope of the embodiments of the present invention. Support for separate second contact pads or partitioned second layer cantilevered portions may be found in pending parent application, U.S. Ser. No. 10/982,051, incorporated by reference herein, cited supra, for example, FIGS. 4B, 7, 9 and 10 and the corresponding description thereof in the pending parent application. Further, any of the embodiments described herein may have a mirror image of the illustrated nano-colonnade VCSEL device 1100, 2100, 3100 similar to that described in the above-referenced pending parent application, and be within the scope of the embodiments of the present invention. See, for example, a mirror image that is illustrated in FIGS. 5, 6, 7 and 10 and the corresponding description thereof in the pending parent application for support of such embodiments.

As mentioned above, the embodiments of the nano-colonnade VCSEL devices 1100, 2100, 3100 are vertical cavity surface emitting laser structures. As such, a light or laser beam (not illustrated) would be emitted from a surface of the respective VCSEL structure 1100, 2100, 3100 perpendicular to a plane of the respective semiconductor layers 1120, 1160, 2120, 2160, 3120, 3160 and essentially aligned or coplanar with the vertical plane of the nanowire column 1180, 2180, 3180. As such, as described above, the second contact pad may not extend on the surface of the second semiconductor layer to overlap or overlie an area of the second semiconductor layer aligned with the vertical nanowire column (e.g., FIGS. 2 and 3). In these embodiments, the laser beam may be emitted through one or both of the first semiconductor layer and the second semiconductor layer at a position essentially aligned with the nanowire column without interference from the contact pads. In other embodiments where the second contact pad overlaps or overlies the aligned area on the second semiconductor layer (e.g., FIG. 1), the second contact pad may be made from a material that does not interfere with the emission of the laser beam, such as an optically transparent material. Otherwise, the laser beam may be emitted from an area of the first semiconductor layer aligned with the nanowire column that is otherwise unobstructed by a contact pad, for example. These and other arrangements that achieve a nonobstructed laser beam emission realized by one skilled in the art are within the scope of the nano-colonnade VCSEL device 1100, 2100, 3100 embodiments of the present invention.

In another embodiment of the present invention, a nano-colonnade VCSEL array device is provided. FIG. 4 illustrates a perspective view of a nano-colonnade VCSEL array device 4100 according to another embodiment of the present invention. The nano-colonnade VCSEL array device 4100 comprises a first semiconductor layer 4120 having a (111) horizontal surface 4122. The nano-colonnade VCSEL array device 4100 further comprises a second semiconductor layer 4160 and an insulator layer support 4140, between the first layer 4120 and the second layer 4160. The second layer 4160 has a horizontal surface 4162 that faces the (111) horizontal surface 4122 of the first layer 4120. Moreover, the second layer 4160 is cantilevered over the first layer 4120 and comprises back-to-back cantilevered portions 4164a, 4164b that overhang the insulator support 4140 on opposite sides of the insulator support 4140. The second layer 4160 and the back-to-back cantilevered portions 4164a, 4164b are supported by the insulator support 4140. The insulator support 4140 effectively separates or delineates the separate cantilevered portions 4164a, 4164b. In some embodiments, the first semiconductor layer 4120 is lattice matched to the second semiconductor layer 4160. In some embodiments, the insulator support 4140 is lattice-matched to one or both of the first layer 4120 and the second layer 4160.

In some embodiments of the nano-colonnade VCSEL array device 4100, the first semiconductor layer 4120 is a semiconductor layer of a semiconductor-on-insulator wafer. As illustrated in FIG. 4 by way of example, the wafer further comprises an insulator layer 4120a and a support layer or substrate 4120b. The semiconductor-on-insulator wafer is the base on which the insulator layer 4140 and the second layer 4160 are formed. Although not specifically illustrated, any of the nano-colonnade VCSEL devices 1100, 2100, 3100 may include a semiconductor-on-insulator wafer and still be within the scope of the embodiments of the present invention. The pending parent application U.S. Ser. No. 10/982,051, cited supra, describes methods of fabricating nano-colonnade structures using semiconductor-on-insulator wafers and where to obtain such wafers including, but not limited to, a silicon-on-insulator (SOI) wafer and a GaAs-on-insulator wafer, for example, which are incorporated herein by reference.

The nano-colonnade VCSEL array device 4100 further comprises a nanowire column 4180 extending from the (111) horizontal surface 4122 of the first layer 4120 to the facing horizontal surface 4162 of the second layer 4160 in each of the cantilevered portions 4164a, 4164b. FIG. 4 illustrates a plurality of such nanowire columns 4180 extending between such surfaces 4122, 4162 by way of example. The nanowire columns 4180 have a precise length defined by a thickness or height of the insulator support 4140, which represents a distance between the respective horizontal surfaces 4122 and 4162 of the first layer 4120 and the second layer 4160. In some embodiments, the nanowire columns 4180 are lattice-matched to one or both of the first semiconductor layer 4120 and the second semiconductor layer 4160. In some embodiments, the nanowire columns 4180 are lattice-matched to one or more of the first semiconductor layer 4120, the second semiconductor layer 4160 and the insulator layer support 4140.

The nano-colonnade VCSEL array device 4100 further comprises distributed Bragg mirrors. In some embodiments, the Bragg mirrors are incorporated into one or more nanowire columns 4180 of the plurality. A first Bragg mirror 4184 is integrated into a nanowire column 4180 near a first end adjacent to the (111) horizontal surface 4122 while a second Bragg mirror 4186 is integrated into the nanowire column 4180 near a second end adjacent to the facing horizontal surface 4162 of the second layer 4160. In some embodiments, the Bragg mirrors 4184, 4186 are similar to that described above for the nano-colonnade VCSEL devices 1100 and 3100.

Although not specifically illustrated in FIG. 4, in some embodiments, the Bragg mirrors may be formed in the first and second layers 4120, 4160 instead of the nanowire columns 4180. The Bragg mirrors in these embodiments of the nano-colonnade VCSEL array device 4100 are similar to that described above and illustrated in FIG. 2 for the nano-colonnade VCSEL device 2100 embodiments and are within the scope of the present invention. Moreover, although not specifically illustrated in FIG. 4, in some embodiments, the nano-colonnade VCSEL array device 4100 further comprises a quantum dot (QD) integrated into one or more of the nanowire columns of the plurality. The QDs in these embodiments of the nano-colonnade VCSEL array device 4100 are similar to that described above and illustrated in FIGS. 1 and 2 for the nano-colonnade VCSEL device 1100, 2100 embodiments and are within the scope of the present invention.

In some embodiments, the nano-colonnade VCSEL array device 4100 further comprises means for making electrical contact to opposite ends of the nanowire columns 4180, such that the optical cavities may be electrically pumped with an electrical current or pulse. In some embodiments, the means for making electrical contact comprises a first contact pad or electrode for each cantilevered portion 4164a, 4164b. The first contact pads 4170a, 4170b are located on the (111) horizontal surface 4122 of the first layer 4120 spaced out from under the cantilevered second layer 4160 of each portion and spaced from the corresponding nanowire columns 4180. In some embodiments, the means for making electrical contact comprises further comprises a second contact pad or electrode 4190 on a surface 4163 of the second layer 4160 opposite from the facing horizontal surface 4162. In some embodiments, the first and second contact pads 4170a, 4170b, 4190 are similar to that described above for embodiments of the nano-colonnade VCSEL devices 1100, 2100, 3100. As illustrated in FIG. 4, the second contact pad 4190 is aligned over the insulator support 4140 in some embodiments. Moreover, the second contact pad may extend onto the cantilevered portions 4164a, 4164b in some embodiments. However, as described above for the second contact pads 1190, 2190, 3190 of the nano-colonnade VCSEL devices 1100, 2100, 3100, the extent of overlap with an area aligned with the nanowire columns 4180 of the plurality may depend on whether the second contact pad 4190 is made of an optically transparent material or not. Moreover, the extent of overlap with an area aligned with the plurality of nanowire columns 4180 may depend on whether light emitted from the nano-colonnade VCSEL array device 4100 is intended to be limited to a direction through either the first layer 4120 or the second layer 4160, as discussed above. In other embodiments, the means for making electrical contact comprises the first layer 4120 and the second layer 4160 being highly doped to impart a target amount of electrical conductivity to the respective layers 4120, 4160 to facilitate electrically pumping of the laser cavities 4180 with an electrical current or pulse. In still other embodiments, the means for making electrical contact comprises various combinations of the electrical contacts 4170a, 4170b, 4190 and the highly doped semiconductor layers 4120, 4160 to facilitate such electrical pumping.

The nano-colonnade VCSEL device 1100, 2100, 3100, 4100 may be useful for display purposes in some embodiments. For example, a large array comprising a plurality of the nano-colonnade VCSEL devices grouped together may be used to form a 'super-bright' laser/light emitting diode (LED) light source. In another example, a dense array comprising a VCSEL device having a plurality of densely spaced nanowire columns may form a 'super-bright' laser light source. In the large array example, the grouped VCSEL devices are in proximity to each other such that the super-bright light is produced. In the dense array example, the VCSEL device nanowire columns are in proximity to each other such that the super-bright light is produced. By 'super-bright' it is meant that each of a large array and a dense array is much brighter than either the plurality of VCSEL devices without being so grouped together or the VCSEL device having fewer or less densely spaced nanowire columns, respectively, such that stimulation by proximity (also referred to as 'proximate stimulation') does not occur. Interactions between co-located adjacent nanowire columns may be considered in proximate stimulation in such arrays. A portion of an electromagnetic field associated with the light generated from the VCSEL device may exist outside the nanowire bulk material due to the narrow dimension of the nanowires in some embodiments. This field portion, which is an external, non-propagating electromagnetic field, is called an evanescent field. In an example, the evanescent field from one nanowire column may interact with another nanowire column and affect display properties of the array device. In another example where the nanowire column includes a QD, the evanescent field from one nanowire column may interact with the QD of another nanowire column to affect the display properties. Specifically, if a spacing between adjacent nanowires is sufficiently small (for example and not by way of limitation, around 10 nm or less), an evanescent field from one nanowire may become coupled to and effectively pump the other adjacent nanowire or its QD, if present, thus further stimulating light emissions. The combined effect of a native emission of the nanowire coupled with its evanescent field stimulated emission from a proximate nanowire may yield a brighter overall light source than is possible for the native emission of the nanowire alone. As such, a distance between or a proximate location of adjacent nanowires may be a consideration in determining whether or not the array is 'super-bright'.

Further, the nano-colonnade VCSEL device 1100, 2100, 3100, 4100 may be useful for facilitating the amplification of a semiconductor optical amplifier (SOA) in some embodiments. For example, an SOA placed in proximity to the VCSEL device will receive and amplify light emitted by the VCSEL device. However, a portion of an electromagnetic field associated with the light generated from the VCSEL device may exist outside the nanowire bulk material due to the narrow dimension of the nanowires in some embodiments. This portion, an external, non-propagating electromagnetic field, is called an evanescent field. The amplification of the light by the SOA may be enhanced by the VCSEL device when the evanescent electromagnetic field from the VCSEL device is coupled into and used to pump an active material of the SOA. As such, the VCSEL device may be an optical amplifier that may facilitate the SOA's amplification of an optical signal received from the VCSEL device as the signal propagates therethrough.

Moreover, the nano-colonnade VCSEL device 1100, 2100, 3100, 4100 may be useful for single molecule detection in some embodiments. A molecule of a substance present in proximity to a nanowire column of the VCSEL device will affect an emission from the nanowire column. For example, the molecule may affect the external, non-propagating field of the nanowire column, such as the evanescent field of the nanowire column. As such, the affected nanowire column may emit a different wavelength of light than if the molecule was not present. An emission of a different wavelength of light from the VCSEL device is detectable, and such detection may infer the presence of the molecule.

In addition, the nano-colonnade VCSEL device 1100, 2100, 3100, 4100 may be useful for a bright light source for lighting or display in some embodiments. For example, a semiconductor material including, but not limited to, gallium nitride (GaN), generates short wavelengths of light, such as one or both of blue light and ultraviolet (UV) light. The blue and/or UV light can be used to stimulate a white light emitting material or means for white light generation that is used in display lighting. The white light emitting material includes, but is not limited to, phosphor. In some embodiments, the means for generating white light comprise the white light emitting material. White light is brighter than blue light or UV light. As such, in some embodiments, the nano-colonnade VCSEL device 1100, 2100, 3100, 4100 comprises nanowire columns of the short wavelength-producing semiconductor material. In these embodiments, the VCSEL device in proximity to the white light emitting material may stimulate the emitting material to make an effectively brighter display light than the emitting material produces without the VCSEL device stimulation. Depending on the embodiment described herein, 'in proximity to' refers to one or more of a position, a location, a physical connection and an electrical connection in relation to the VCSEL device and the respective material, means or device that either the VCSEL device affects or the VCSEL device is affected by.

In another embodiment of the present invention, a nano-colonnade VCSEL device with one or both of an on-chip laser pump and an electrical pump is provided. FIG. 5 illustrates a perspective view of a nano-colonnade VCSEL device with an integral pump 5100 according to another embodiment of the present invention.

The nano-colonnade VCSEL device with an integral pump 5100 comprises a first semiconductor layer 5120 having a (111) horizontal surface 5122. The nano-colonnade VCSEL device 5100 further comprises a second semiconductor layer 5160 and an insulator layer support 5140 between the first layer 5120 and the second layer 5160. The second layer 5160 has a cantilevered portion 5164 with a horizontal surface 5162 that faces the (111) horizontal surface 5122 of the first layer 5120. The cantilevered portion 5164 is supported by the insulator support 5140. In some embodiments, the first semiconductor layer 5120 is lattice matched to the second semiconductor layer 5160. In some embodiments, the insulator support 5140 is lattice-matched to one or both of the first layer 5120 and the second layer 5160. Moreover in some embodiments, one or both of the first layer 5120 and the second layer 5160 are doped with one or both of a p-type dopant and an n-type dopant to impart respective target levels of electrical conductivity to the first and second layers.

The nano-colonnade VCSEL device with an integral pump 5100 further comprise a nanowire column 5180 extending from the (111) horizontal surface 5122 of the first layer 5120 to the facing horizontal surface 5162 of the cantilevered portion 5164 of the second layer 5160. The nanowire column 5180 has a precise length defined by a thickness or height of the insulator layer support 5140, which represents a distance between the respective horizontal surfaces 5122 and 5162 of the first layer 5120 and the second layer 5160. In some embodiments, the nanowire column 5180 is lattice-matched to one or both of the first semiconductor layer 5120 and the second semiconductor layer 5160. In some embodiments, the nanowire column 5180 is further lattice-matched to the insulator support 5140. By way of example only and not by way of limitation, FIG. 5 illustrates three such nanowire columns 5180 in the nano-colonnade VCSEL device 5100.

The nano-colonnade VCSEL device with an integral pump 5100 further comprises distributed Bragg mirrors 5184, 5186 that are located in a spaced apart fashion along the length of the nanowire column 5180, similar to that described above for the nano-colonnade VCSEL devices 1100, 3100. In some embodiments, the Bragg mirrors 5184, 5186 are introduced into the nanowire column 5180 during nanowire growth. The Bragg mirrors 5184, 5186 delineate opposite ends of a laser or optical cavity with the nanowire column 5180. The nano-VCSEL device 5100 further comprises means 5188 for emitting a single photon that is in or on the nanowire column 5180. In some of these embodiments, the single photon emitting means is a quantum dot (QD) 5188, similar to that described above for the nano-colonnade VCSEL devices 1100, 2100 embodiments. The QD 5188 is spaced from the first nanowire Bragg mirror 5184 and the second nanowire Bragg mirror 5186 at a position along the nanowire length. In some embodiments, the QD 5188 is also introduced into the nanowire column 5180 during nanowire growth. In some embodiments, the distributed Bragg mirrors of the nano-VCSEL device 5100 may be integrated into the first layer and the second layer, respectively, instead of in the nanowire column and still be within the scope of the present invention. The Bragg mirrors 5184, 5186 define a cavity around the QD 5188 to facilitate amplification of signals from the QD 5188, such that the QD 5188 is more efficient relative to a QD without such a defined cavity. Hereinbelow, the defined laser cavity may be referred to as the 'nanowire laser cavity 5180' or the 'VCSEL laser cavity 5180'.

In some embodiments, the nano-colonnade VCSEL device with an integral pump 5100 further comprises means for pumping a laser cavity. In some embodiments, the means for pumping comprises means 5130 for electrically pumping a laser cavity. In some embodiments, the means for pumping comprises means 5150 for optically pumping a laser cavity. In some embodiments, the means for pumping comprises both the electrical pumping means 5130 and the optical pumping means 5150, as further described below.

In some embodiments, the means 5130 for electrically pumping comprises the first semiconductor layer 5120 being highly doped to impart a target electrical conductivity to the layer 5120 to make an electrical contact or connection with a first end of the nanowire laser cavity 5180. In some of these embodiments, the means 5130 for electrically pumping further comprises the second semiconductor layer 5160 also being highly doped to make an electrical contact with a second end of the nanowire laser cavity 5180, such that the QD 5188 in the laser cavity 5180 is electrically accessible at each end of the laser cavity 5180. The target electrical conductivity is sufficient to support an electrical current or pulse to pump the nanowire laser cavity 5180 and the QD 5188 of a VCSEL section of the device 5100.

In some embodiments, the means 5130 for electrically pumping comprises a first contact pad or electrode 5170 adjacent to or on the (111) horizontal surface 5122 of the first semiconductor layer 5120. The first contact pad 5170 is spaced apart from the nanowire column 5180 and located out from under the cantilever portion 5164 of the second layer 5160. In some of these embodiments, the means 5130 for electrically pumping further comprises a second contact pad or electrode 5190 adjacent to or on a horizontal surface 5163 of the second layer 5160 that is opposite to the facing horizontal surface 5162. The contact pads 5170, 5190 are electrically conductive and similar to that described above for the first and second contact pads 1170, 1190, 2170, 2190, 3170, 3190, 4170a, 4170b, 4190 of the nano-colonnade VCSEL devices 1100, 2100, 3100, 4100, such that the QD 5188 in the nanowire laser cavity 5180 is electrically accessible at each end of the laser cavity. The second contact pad 5190 extends over a portion of the second layer surface 5163 similar to that described above and illustrated in FIGS. 1-3 for the embodiments of the nano-colonnade VCSEL devices 1100, 2100, 3100. In some embodiments, the means 5130 for electrically pumping comprises both the highly doped semiconductor layers 5120, 5160 and the electrical contact pads 5170, 5190. In some embodiments, the means 5130 for electrically pumping comprises a combination selected from the highly doped first layer 5120, the highly doped second layer 5160, the first contact pad 5170 and the second contact pad 5190 that imparts the electrical connectivity to support an electrical current or pulse to electrically pump the VCSEL nanowire laser cavity 5180 and the QD 5188. FIG. 5 illustrates the means 5130 for electrically pumping generally with an arrow 5130 at the first end of the laser cavity 5180 (with respect to the first layer 5120 and the first contact pad 5170) and an arrow 5130 at the second end of the laser cavity 5180 (with respect to the second layer 5160 and the second contact pad 5190) for that reason.

In some embodiments, the nano-colonnade VCSEL device with an integral pump 5100 further comprises means 5150 for optically pumping integrated on the first semiconductor layer 5120. The optical pumping means 5150 comprises an optical pump that pumps the nanowire laser cavity 5180 of the VCSEL section of the device 5100. In particular, the optical pumping means 5150 pumps the QDs 5188 of the nanowire columns 5180. In some embodiments, the optical pumping means 5150 comprises an edge emitting laser 5150. An edge emitting laser emits light from an end or edge of a horizontal optical cavity rather than from a surface of a vertical optical cavity, as described above. In some embodiments, the edge emitting laser 5150 is a distributed feedback (DFB) laser that emits a target wavelength of light in a direction from an end or edge of the laser cavity. The bold horizontal arrow illustrated in FIG. 5 identifies the direction of the light emitted from an output of the edge emitting laser 5150, by way of example. Also, by way of example, the bold vertical arrows identify possible vertical directions of a light emitted from the VCSEL section of the device 5100.

The DFB laser will emit light or a laser beam at essentially one wavelength due to a wavy or corrugated grating above the active layer of the horizontal laser cavity of the DFB laser. Light traveling through the horizontal cavity will contact the grating. The grating serves to reflect a target wavelength of light back into the horizontal cavity, while letting other wavelengths of light to pass through the grating. The grating is made up of materials having different refractive indices, wherein the materials form component sides of the corrugated grating. The sides are spaced apart and angled to reflect the target wavelength of light along the length of the horizontal cavity, such that the target wavelength of light builds up in the cavity. As such, the DFB laser will emit this target wavelength of light from a facet at an end or output of the horizontal laser cavity facing the nanowire columns 5180.

In some embodiments, the edge emitting laser 5150 is formed on the (111) horizontal surface 5122 of the first semiconductor layer 5120 to integrate the edge emitting laser 5150 with the nano-colonnade VCSEL section of the device 5100. In other embodiments, the edge emitting laser 5150 is prefabricated and attached to the (111) horizontal surface 5122 to so integrate the laser 5150. The edge emitting laser 5150 is spaced from the cantilevered portion 5164 and the nanowire columns 5180, such that the output end or edge of the laser 5150 faces the nanowire columns 5180. In the embodiments including the first electrode 5170, the DFB laser 5150 may be adjacent to and either spaced from or in contact with the first electrode 5170 on the (111) horizontal surface 5122 of the first semiconductor layer 5120 depending on the embodiment.

As mentioned above, the DFB laser 5150 will emit light at a target wavelength, for example, to optically pump the QDs 5188 of the VCSEL nanowire laser cavity 5180. In some embodiments, the target wavelength of the light emitted from the DFB laser 5150 is a shorter wavelength than a wavelength of the single photons emitted from the optically pumped QDs 5188.

Figure 6:
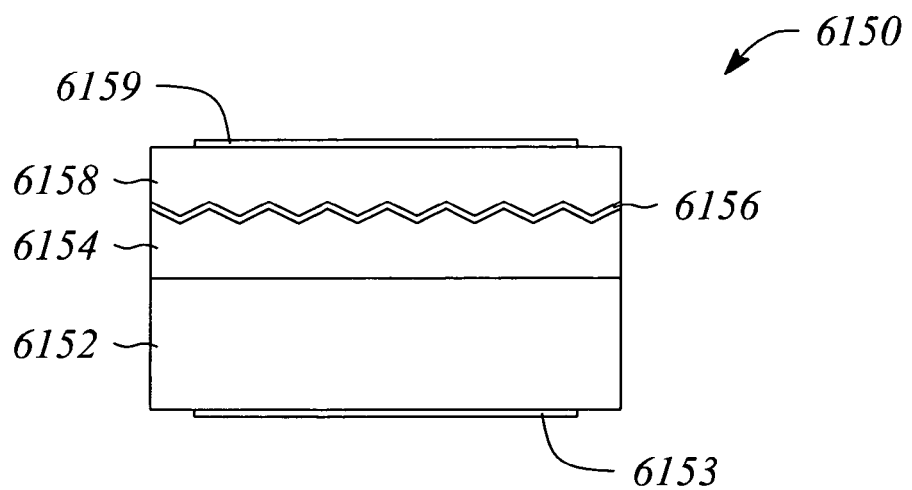
FIG. 6 illustrates a side view of a distributed feedback (DFB) laser according to another embodiment of the present invention.

FIG. 6 illustrates a side view of a DFB-type edge emitting laser 6150 according to an embodiment of the present invention. The DFB laser 6150 comprises a first pump layer 6152 of a semiconductor material. The DFB laser 6150 further comprises an optical or laser cavity layer 6154 that is formed on the first pump layer 6152. The DFB laser 6150 further comprises a corrugated grating layer 6156 that is formed on the cavity layer 6154, and a second pump layer 6158 of a semiconductor material that is formed on the grating layer 6156. In some embodiments, the grating layer 6156 is a corrugated portion of either the cavity layer 6154 or the second pump layer 6158 and not a separate layer. The semiconductor materials and methods of fabricating a DFB laser are known in the art.

In some embodiments, the DFB laser 6150 further comprises a pump contact pad or electrode 6153 that is provided on or adjacent to the first pump layer 6152. In some embodiments, the DFB laser 6150 further comprises a pump contact pad 6159 that is provided on the second pump layer 6158. The pump contact pads are electrically conductive and similar to that described above for the first and second contact pads 1170, 1190, 2170, 2190, 3170, 3190 of the nano-colonnade VCSEL devices 1100, 2100, 3100. One or both of the pump contact pads 6153, 6159 facilitate electrically accessing the laser cavity 6154 of the DFB laser 6150 with an electrical current or pulse, such as applying the electrical current in a direction normal to the horizontal laser cavity layer 6154. In some embodiments, the DFB laser 6150 further comprises both a first pump contact pad 6153 and a second pump contact pad 6159, as described above. In some embodiments, the integrated edge emitting laser 5150 of FIG. 5 is equivalent to that described above for the DFB-type laser 6150 illustrated in FIG. 6, such that the first pump semiconductor layer 6152 is formed on or attached to the first semiconductor layer 5122 of the nano-colonnade VCSEL section of the device 5100, depending on the embodiment.

As mentioned above, in some embodiments, the means for pumping a laser cavity comprises the means 5150 for optically pumping. In some embodiments, the means for pumping a laser cavity comprises both the electrical pumping means 5130 and the optical pumping means 5150. In some of these embodiments, the means 5130 for electrically pumping pumps the optical pump (i.e., the edge emitting laser or the DFB laser 5150), which in turn will optically pump the VCSEL nanowire laser cavity 5180. As such, in some embodiments, the means 5130 for electrically pumping further comprises one or more of the first pump contact pad 6153, the second pump contact pad 6159, a highly doped first pump layer 6152, and a highly doped second pump layer 6158 in a combination, such that the combination respectively provide electrodes or electrical connectivity to support an electrical current or pulse for such electrical pumping of the optical cavity layer 6154 of the edge emitting DFB laser 5150, 6150 in addition to or in lieu of the electrical connectivity to the VCSEL laser cavity 5180. FIG. 5 further illustrates this embodiment of the means 5130 for electrically pumping generally with another arrow 5130 near the edge emitting laser 5150 for that reason. When electrically pumped, the DFB laser 5150, 6150 emits the target wavelength of light toward the nanowire columns 5180 to optically pump the QDs 5188, such that single photon emissions result from the nano-colonnade VCSEL device 5100. In some embodiments, the means 5130 for electrically pumping essentially comprises electrical connections between the first layer 5120 and one or both of the second layer 5160 and the optical pump 5150, such that electrical connectivity is selectively established to electrically pump one or both of the quantum dot 5188 in the nanowire laser cavity 5180 and the optical pump 5150. As such, the nano-colonnade VCSEL device with an integral pump 5100 is a self-contained emitter or light source, according to various embodiments of the present invention. Moreover, the nano-colonnade VCSEL device with an integral pump 5100 may be used in any of the embodiments of the display device, optical amplifier, detector and display light source that are described above with respect to the VCSEL devices 1100, 2100, 3100, 4100.

Figure 7:
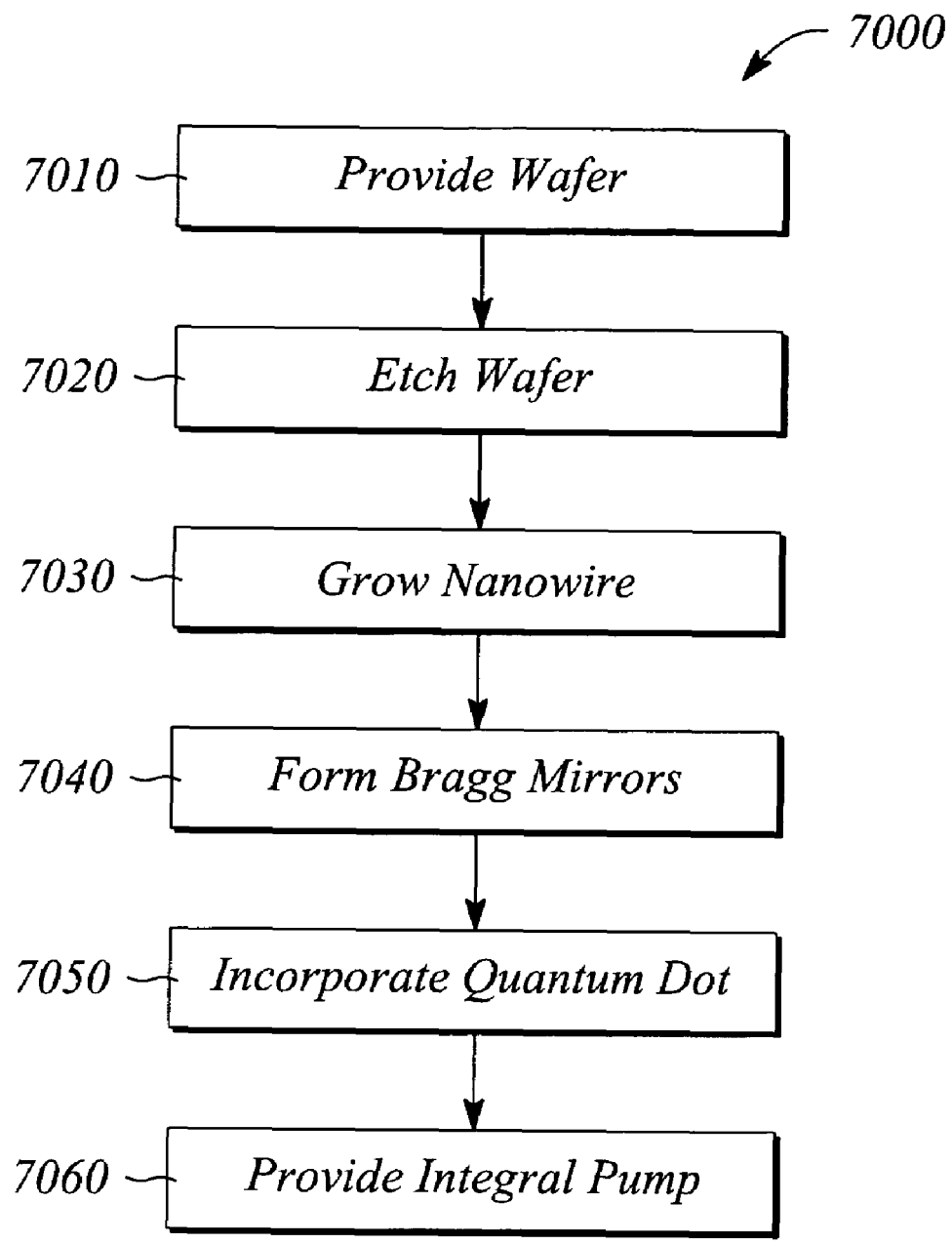
FIG. 7 illustrates a flow chart of a method of fabricating a nano-colonnade VCSEL device according to an embodiment of the present invention.

In some embodiments of the present invention, a method of fabricating a nano-colonnade VCSEL device is provided. FIG. 7 illustrates a flow chart of a method 7000 of fabricating a nano-colonnade VCSEL device according to an embodiment of the present invention. The method 7000 of fabricating comprises providing 7010 a wafer having a material that acts as an insulating layer sandwiched between a (111) horizontal surface of a first semiconductor layer and a second layer. The pending parent application, U.S. Ser. No. 10/982,051, cited supra, provides various examples of providing a wafer for the purposes of the embodiments of the present invention, which are incorporated herein by reference.

For example, in some embodiments, the wafer or substrate is provided 7010 comprising using a silicon-on-insulator (SOI) wafer polished in a [111] direction. The (111) silicon is the first semiconductor layer. The insulator is a handle or support for the (111) silicon. Providing 7010 the wafer further comprises growing a material that can act as an insulator layer on the (111) silicon layer. For example, a silicon dioxide ($SiO_2$) layer can be grown using known techniques on the (111) silicon layer. The grown insulator layer is considered partly sacrificial for reasons described below. Providing 7010 the wafer further comprises growing an epitaxial layer of silicon on the $SiO_2$ insulator layer. The epitaxially grown silicon layer is the second semiconductor layer. Herein, 'growing' with respect to the wafer layers is intended to be used interchangeably with 'depositing' and is not intended to be limited to any particular technique for forming the respective layer, unless otherwise indicated. For example, epitaxy growth is considered a deposition technique. Hereinafter, 'growing' and/or 'depositing' may be referred to more generally as 'forming' for simplicity purposes and without limitation.

In other embodiments, the wafer or substrate is provided 7010 comprising using a GaAs-on-insulator wafer polished in the [111] direction. The GaAs layer is the first semiconductor layer with the (111) horizontal surface. The insulator is a handle or support for the GaAs layer. Providing 7010 further comprises growing a material that will act as an insulating layer, such as AlAs or InAs, for example. Similar to that described above for the SOI wafer, providing 7010 further comprises epitaxially growing a GaAs layer on the AlAs or InAs layer. The epitaxially grown GaAs layer is the second semiconductor layer having any crystal orientation. As long as the AlAs or InAs layer is undoped, it will provide sufficient insulating properties to isolate the GaAs layers. Optionally, the AlAs or InAs layer may be selectively oxidized after the second GaAs semiconductor layer is patterned to enhance the isolation between the GaAs layers.

Moreover, in some embodiments, similar lattice matched semiconductor materials can be grown on InP to implement an optoelectronic device, such as a VCSEL. For example, a semi-insulating $In_{(0.52)}Al_{(0.48)}As$ layer may be grown on a doped InP wafer, followed by growing another doped InP layer on the semi-insulating layer. All of such layers are lattice matched in these embodiments.

In some embodiments, the first semiconductor layer and the second semiconductor layer of the provided 7010 wafer or substrate are both epitaxially grown using techniques including, but not limited to, molecular beam epitaxy (MBE), molecular beam chemical vapor deposition (MOCVD) and CVD, for example. The first semiconductor layer is grown on an insulating substrate or support and has a (111) horizontal surface. A material that will act as an insulator is grown, deposited or formed on the grown first semiconductor layer. Then, the second semiconductor layer is grown on the insulator material layer and has any crystal orientation.

In some embodiments, providing 7010 the wafer or substrate further comprises doping one or both of the first and second semiconductor layers with a p-type and/or an n-type dopant, according to known techniques for doping, to achieve a target electrical conductivity (e.g., highly doped for electrodes) or a depletion region, for example. The semiconductor layers may be doped to achieve any particular dopant level, dopant gradients or depletion region. Moreover, in some embodiments, providing 7010 further comprises integrating different material layers into one or both of the first and second semiconductor layers, depending on the embodiment of the nano-colonnade VCSEL device being fabricated.

The method 7000 of fabricating a nano-colonnade VCSEL device further comprises etching 7020 the wafer to expose a section of the (111) surface and to cantilever a portion of the second layer over the exposed surface section. Etching 7020 comprises etching the second semiconductor layer, and further etching the insulator layer between the semiconductor layers. The insulator layer is etched 7020 partly sacrificially, such that a portion of the second semiconductor layer is cantilevered by the etched insulator layer over the exposed portion of the first semiconductor layer. The insulator layer remaining after etching 7020 essentially supports the cantilevered portion of the second semiconductor layer. The cantilevered portion of the second semiconductor layer has an exposed horizontal surface that faces the exposed (111) horizontal surface of the first semiconductor layer in a spaced apart, vertically stacked relationship. The pending parent application, U.S. Ser. No. 10/982,051, cited supra, describes techniques and materials for etching wafers in accordance with the embodiments of the present invention, which are incorporated herein by reference.

For example, etching 7020 the wafer comprises patterning the second semiconductor layer such that some of the second layer is removed. A masking material may be applied to the surface and patterned, for example, such that the patterned mask covers those areas of the surface which are not to be removed and does not cover those areas which are to be removed. Then an etchant is used to remove the areas of the second layer that are unprotected by the mask. The materials and methods of masking and removing (i.e., 'patterning') are dependent on the semiconductor material used for the second semiconductor layer and are known in the art and not considered a limitation herein. All of such materials and methods are within the scope of the method 7000 embodiments herein.

One or more techniques including, but not limited to, e-beam lithography, photolithography, ion milling, reactive ion etching (RIE), and wet chemical etching may be used, depending on the embodiment. For example, potassium hydroxide (KOH) is a wet chemical etchant useful for etching silicon, and hydrofluoric acid (HF) is a wet chemical etchant useful for etching $SiO_2$. GaAs may be wet chemically etched with $H_2SO_4$. Moreover, it is within the scope of the various embodiments described herein to use a combination of dry and wet etching processes for some semiconductors wafers, such as for a Group III-V compound semiconductor. For example, dry etching (e.g., RIE) followed by wet etching to smooth the dry-etched surfaces may be used. Also see the references cited in the above-referenced pending parent application, which are readily available to those skilled in the art, and are incorporated herein by reference.

In some embodiments, the second semiconductor layer is patterned to open a trench or gap in the second semiconductor layer, thereby leaving separated sections of the second semiconductor layer on either side of the gap. In other embodiments, the second semiconductor layer is patterned to leave a second layer section on a side of the wafer, while removing the rest of the second semiconductor layer. In still other embodiments, the second semiconductor layer is patterned to leave a section of the second layer in an approximate middle of the wafer, while removing the second semiconductor layer from opposite sides of the middle section. Numerous other patterns of the etched second semiconductor layer may be produced by etching 7020, all of which are within the scope of the method 7000.

Etching 7020 the wafer further comprises etching the insulator layer exposed by patterning the second semiconductor layer. Etching the insulator layer comprises removing the insulator layer through an opening in the second semiconductor layer to expose the (111) horizontal surface of the first semiconductor layer. Depending on the pattern of the removed second semiconductor layer, a sacrificial amount of the insulator layer is removed to cantilever a portion of the remaining second semiconductor layer over the exposed (111) surface while an unsacrificial amount of the insulator layer remains to support the cantilevered portion of the second semiconductor layer. As a result, the cantilevered portion of the second semiconductor layer, supported by the remaining insulator layer, hangs over the first semiconductor layer with a horizontal surface of the cantilevered portion facing the exposed (111) surface of the first semiconductor layer. As mentioned above for the second semiconductor material, the materials and methods of removing the insulator layer are dependent on the material used for the insulator layer and are known in the art. All of such materials and methods are within the scope of the method 7000 embodiments herein. For example, one or more of a lithographic technique, a dry etching technique (e.g., RIE) or a wet chemical etching technique may be used, that is capable of removing the insulator layer anisotropically, including partly removing the insulator layer from under the second semiconductor layer. As such, the technique used will undercut the insulator layer through the opening in the patterned second semiconductor layer to form the cantilevered portion of the second layer.

The method 7000 of fabricating a nano-colonnade VCSEL device further comprises growing 7030 a nanowire column from the exposed (111) surface to a facing horizontal surface of the cantilevered portion to bridge the first layer and the second layer. Methods of growing nanowires and the mechanisms of growth are known. All of such methods and mechanisms of growth are within the scope of the embodiments described herein. See for example, pending application U.S. Ser. No. 10/738,176, filed Dec. 17, 2003, which is incorporated by reference in its entirety herein. Moreover, see pending parent application, U.S. Ser. No. 10/982,051, cited supra, also incorporated by reference in its entirety herein. As described in the co-pending applications, metal-catalyzed growth employs a metal nanoparticle catalyst that can produce highly oriented, metal-catalyzed nanowires using chemical vapor deposition (CVD). Typical metal nucleating catalyst materials include, but are not limited to titanium (Ti), gold (Au), iron (Fe), cobalt (Co), gallium (Ga), and alloys thereof. Nonmetal catalyzed growth is also known. A typical nonmetal catalyst material is $SiO_x$, where x ranges from about 1 to less than 2, for example. Typical nanoparticle catalysts corresponding to Ti and Au catalyst materials, for example, are respectively $TiSi_2$ and Au—Si alloy.

The nucleating catalyst material is deposited on a surface in a very thin layer and annealed in a controlled environment (i.e., chamber) to form isolated nanoparticles of the catalyst material. Alternatively, when the nanoparticle catalyst is directly deposited, annealing may be optional. Then, a nanowire material-containing gas is introduced into the controlled environment. The nanoparticle catalyst accelerates decomposition of the gas, such that atoms of the nanowire material precipitate between the nanoparticle catalyst and the (111) horizontal surface to initiate nanowire growth 7030.

The nanowire will grow 7030 from under the nanoparticle on the (111) horizontal surface in columnar form, taking the nanoparticle with it at its tip, to bridge across a space between the (111) surface and a facing horizontal surface. The nanowire with the nanoparticle tip will contact and further attach or weld to the facing horizontal surface with continued catalyzed decomposition of the gas. The attachment is epitaxial in nature, is mechanically strong and robust and has a low electrical resistance, which may be due to the epitaxial attachment. The attachment mechanism is dependent on the nanoparticle type. For example, Ti-containing nanoparticle remains a solid at the tip of the growing nanowire, while Au-containing alloy nanoparticle remains molten at the nanowire tip. Their mechanisms for attachment to the facing surface have different characteristics. The co-pending applications, cited supra, describe mechanisms of attachment to the facing surface for solid and liquid phase nanoparticle types.

For example, growing 7030 comprises depositing a nanoparticle on the (111) horizontal surface of the first semiconductor layer through the opening created in the etched 7020 wafer, such that the nanoparticle is at least deposited on areas of the (111) surface that underlie the cantilevered portion of the second semiconductor layer. Herein, the term 'nanoparticle' is used interchangeably to describe a catalyst material deposited and annealed into a nanoparticle catalyst and a nanoparticle catalyst directly deposited with optional annealing, unless a distinction is warranted. A number of catalyst materials and nanoparticle catalysts have been described and/or referenced above that may be used in the various embodiments of the present invention.

In some embodiments, the nanoparticle is deposited at an angle to a plane or planes defining the opening in the patterned second semiconductor layer. Angle deposition facilitates depositing the nanoparticle on the areas of the (111) surface that underlie the cantilevered portion of the second semiconductor layer. Growing 7030 further comprises growing the nanowire column from a location of the nanoparticle on the (111) horizontal surface in a direction approximately vertical to the (111) surface to contact and connect or attach to the facing horizontal surface of the cantilevered portion of the second semiconductor layer, as described above.

In some embodiments, growing 7030 the nanowire column further comprises doping the nanowire column to impart or enhance a target characteristic or property, such as electrical conductivity, depletion, and sensitivity. A variety of factors may affect depletion characteristics that include, but are not limited to, depletion region thickness, nanowire diameter, dopant used, dopant concentration, solid solubility of the dopant in the semiconductor material of the nanowire, and quantum effects. For example, a silicon nanowire column may be grown 7030 using an $H_2/SiH_4/HCl$ gas in a CVD deposition chamber. During the introduction of the $H_2/SiH_4/HCl$ gas, a p-type dopant, such as a diborane $B_2H_6$ gas, can be added to the $H_2/SiH_4/HCl$ gas ambient. As such, nanowire columns having a diameter of about 100 nm may incorporate the p-type boron dopant into the nanowire columns during growth 7030 at concentrations from about low-$10^{17}/cm^3$ to about mid-$10^{18}/cm^3$, for example and not by way of limitation herein.

In some embodiments, growing 7030 further comprises removing extraneous nanowire columns, which are nanowire columns that grow but do not bridge the first semiconductor layer to the second semiconductor layer. The extraneous nanowire columns may be removed with RIE, for example, or using another technique, that will selectively remove the extraneous nanowire columns.

The method 7000 of fabricating a nano-colonnade VCSEL device further comprises delineating a vertical optical cavity with the nanowire column. In some embodiments, the vertical optical cavity is delineated by forming 7040 distributed Bragg mirrors adjacent to opposite ends of the nanowire column. The distributed Bragg mirrors may be formed 7040 in either the first and second semiconductor layers or the nanowire column. The pending parent application U.S. Ser. No. 10/982,051, cited supra, describes techniques for forming distributed Bragg mirrors in either the semiconductor layers or the nanowire column to delineate the vertical optical cavity, which are incorporated herein by reference.

In some embodiments, the method 7000 of fabricating a nano-colonnade VCSEL device further comprises introducing a single photon emitter into the optical cavity. In some embodiments, the single photon emitter is introduced by incorporating 7050 a quantum dot (QD) in the growing 7030 nanowire column, such that the quantum dot is spaced from the distributed Bragg mirrors. Techniques and materials for incorporating 7050 a QD into a growing 7030 nanowire column are discussed in the above-referenced pending parent application and are incorporate herein by reference.

For example, in some embodiments, incorporating 7050 a QD into the growing 7030 nanowire column comprises introducing a small quantity of a material having a different band gap than the growing nanowire, for example. The QD is like a quantum well where different energy levels are achieved. Since a QD is a cluster of atoms that forms a super atom, the small quantity can have an energy level like a single atom. For example, a nanowire column of InP (having a high band gap) may be grown 7030 for a period of time. A small segment of InGaAs (having a low band gap) may be introduced 7050 (i.e., grown) near a mid-point of the growing 7030 InP nanowire column, for example. Then, the growth 7030 of the InP nanowire column is resumed.

In some embodiments, the method 7000 of fabricating a nano-colonnade VCSEL device further comprises providing 7060 an integral pump including one or both of an optical pump and an electrical pump. The optical pump is provided 7060 on the first layer. In some embodiments, the optical pump comprises an edge emitting laser. In some embodiments, the edge emitting laser comprises a distributed feedback (DFB) laser.

The optical pump may be a prefabricated DFB laser that is attached to the (111) horizontal surface using conventional semiconductor grade adhesives, solders or other means for attachment that provides an electrically conductive path from the first layer to the DFB laser in some embodiments. In other embodiments, the DFB laser is fabricated during or after the fabrication of the nano-colonnade VCSEL using standard semiconductor processing and etching techniques known in the art. For example, the DFB laser may be grown on the wafer using a separate growth process in target areas of the wafer. In this example, the separate growth process may be a regrowth method that provides for on-chip integration. Such growth processes and re-growth method use conventional semiconductor processing techniques and materials. The DFB laser is aligned on the (111) horizontal surface, such that an output of the DFB laser is directed toward the nanowire column and specifically toward the quantum dot. The DFB laser is provided 7060 to optically pump the quantum dot for single photon emissions from the nano-colonnade VCSEL device.

In some embodiments, the electrical pump is provided 7060 comprising forming electrically conductive contacts on one or more of the (111) horizontal surface of the first semiconductor layer, a horizontal surface of the second semiconductor layer that is opposite the facing horizontal surface thereof, a surface of the DFB laser that is adjacent to the (111) horizontal surface of the first layer, and a surface of the DFB laser that is opposite to the adjacent surface, such that electrical connectivity is provided to one or both of opposite ends of the nanowire column and opposite ends of the optical pump, depending on the embodiment. The electrical contacts are formed using conventional techniques for deposition and patterning discussed above and as is known in the art. In some embodiments, one or more of the electrical contacts are formed by highly doping the respective semiconductor layers associated with the above-mentioned surfaces for the respective electrical contact. A respective semiconductor layer is highly doped to impart a target electrical conductivity to the layer such that electrical conductivity between the above-mentioned surfaces is achieved. The first and second semiconductor layers may be highly doped during providing 7010 a wafer. The semiconductor layers of the DFB laser may be highly doped during prefabrication or during providing 7010 a wafer, depending on the embodiment. The respective semiconductor layers are doped using conventional techniques discussed above and as is known in the art.

In some embodiments of the method 7000 of fabricating, forming 7040 distributed Bragg mirrors comprises integrating a first set of Bragg reflector layers into the first semiconductor layer adjacent to the (111) horizontal surface. In these embodiments, forming 7040 further comprises integrating a second set of Bragg reflector layers into the second semiconductor layer adjacent to the facing horizontal surface.

In some embodiments, one or more materials with indices of refraction that differ may be grown in alternating layers on the respective semiconductor layer to form 7040 the integrated Bragg reflector. The Bragg reflector layers are grown also by techniques including, but not limited to, molecular beam epitaxy (MBE), molecular beam chemical vapor deposition (MOCVD) and CVD, for example, with target thicknesses. At least one of the materials has an index of refraction that is different from the index of refraction of the semiconductor layer material in which it is integrated. In some embodiments, the Bragg reflector materials are lattice matched to the semiconductor layer material. For example, GaAs and AlAs have indices of refraction that differ by about 0.5. On a GaAs semiconductor layer (e.g., the first semiconductor layer), a few alternating layers of AlAs and GaAs are grown to target thicknesses, which depend on a wavelength of light to be reflected, to make a Bragg reflector. See for example, Ekmel Özbay et al., M. Saiful Islam, et al., "Fabrication of High-Speed Resonant Cavity Enhanced Schottky Photodiodes", *IEEE Photonics Technology Letters*, Vol. 9, No. 5, May 1997, pp. 672-674, incorporated herein by reference.

In some embodiments of the method 7000 of fabricating, forming 7040 distributed Bragg mirrors comprises integrating a first set of Bragg reflector layers into the growing 7030 nanowire column near a first end adjacent to the (111) horizontal surface. In these embodiments, forming 7040 further comprises integrating a second set of Bragg reflector layers into the growing 7030 nanowire column near a second end adjacent to the facing horizontal surface. The Bragg reflector materials are introduced near opposite ends of the growing 7030 nanowire using materials and techniques similar to that discussed above for the Bragg reflectors being introduced into one or both of the first semiconductor layer and the second semiconductor layer. For example, materials having different indices of refraction may be introduced into the nanowire during growth 7030 in alternating layers to form 7040 a Bragg reflector in the nanowire column. At least one of the materials has an index of refraction that is different from the index of refraction of the nanowire material.

In some of these embodiments of the method 7000 of fabricating, incorporating 7050 a quantum dot into the nanowire column comprises incorporating the quantum dot after the first set of Bragg reflector layers are formed 7040 in the growing 7030 nanowire column, but before the second set of Bragg reflector layers are formed 7040 in the growing 7030 nanowire column. The QD is incorporated 7050, such that it is located between and spaced from the first set of Bragg reflector layers and the second set of Bragg reflector layers. Techniques and materials for incorporating 7050 the quantum dot into the growing 7030 nanowire column between forming 7040 the distributed Bragg mirrors are discussed above.

Effectively, various embodiments of the present invention provide devices that are efficient emitters, such as single photon emitters, lasers, LEDs and displays. As described herein, the emitter devices are fabricated with a bottom-up approach to growing or synthesizing nanowires that uses various CVD techniques to grow the nanowires between prefabricated or in situ biasing electrodes. In some embodiments, the QD may create cavities with three-dimensional photon confinement and discrete modes. In some embodiments, the VCSEL laser cavity is pumped using optical pumping. In some embodiments, electrical pumping can be used rather than using optical pumping, such that efficiency may be improved. Further, in some embodiments, high speed biasing circuits can be monolithically integrated on a respective wafer for pulsed electrical pumping for the single photon emission.

Thus, there have been described various embodiments of nano-colonnade VCSEL devices and a method of fabricating a nano-colonnade VCSEL device. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A nano-colonnade vertical cavity surface emitting laser (VCSEL) device comprising:
   a first layer having a (111) horizontal surface;
   a second layer;
   an insulator support between the first layer and the second layer that separates the first layer from the second layer, a portion of the second layer overhanging the insulator support, such that a horizontal surface of the overhanging portion is spaced from and faces the (111) horizontal surface of the first layer;
   a nanowire column extending nearly vertically from the (111) horizontal surface to the facing horizontal surface of the overhanging portion; and
   distributed Bragg mirrors adjacent to opposite ends of the nanowire column.

2. The nano-colonnade VCSEL device of claim 1, wherein the distributed Bragg mirrors comprises a first Bragg mirror and a second Bragg mirror, the first layer comprising the first Bragg mirror adjacent to the (111) horizontal surface, the second layer comprising the second Bragg mirror adjacent to the facing horizontal surface, such that the distributed Bragg mirrors form a vertical optical cavity with the nanowire column.

3. The nano-colonnade VCSEL device of claim 2, further comprising a quantum dot integrated in the nanowire column spaced from the first Bragg mirror and the second Bragg mirror.

4. The nano-colonnade VCSEL device of claim 1, wherein the distributed Bragg mirrors comprises a first Bragg mirror and a second Bragg mirror, the nanowire column comprising the first Bragg mirror adjacent to a first end of the nanowire column-near the (111) horizontal surface of the first layer, the nanowire column further comprising the second Bragg mirror adjacent to a second end of the nanowire column near the facing horizontal surface of the second layer, such that the distributed Bragg mirrors form a vertical optical cavity with the nanowire column.

5. The nano-colonnade VCSEL device of claim 4, further comprising a quantum dot integrated in the nanowire column between and spaced from the first Bragg mirror and the second Bragg mirror.

6. The nano-colonnade VCSEL device of claim 5, further comprising an optical pump on the first layer, the optical pump having an output, the output being directed at the nanowire column to optically pump the quantum dot.

7. The nano-colonnade VCSEL device of claim 1, wherein the distributed Bragg mirrors comprises a first set of Bragg reflector layers and a second set of Bragg reflector layers, the first set being integrated into either the first layer or the nanowire column adjacent to the (111) horizontal surface, the second set being integrated into either the second layer or the nanowire column adjacent to the facing horizontal surface, such that the first set of Bragg reflector layers and the second set of Bragg reflector layers delineate a vertical optical cavity with the nanowire column.

8. The nano-colonnade VCSEL device of claim 7, further comprising a quantum dot integrated in the nanowire column spaced from the first set of Bragg reflector layers and the second set of Bragg reflector layers.

9. The nano-colonnade VCSEL device of claim 8, further comprising a distributed feedback (DFB) laser on the (111) horizontal surface of the first layer, the DFB laser having an output directed at the nanowire column, the DFB laser optically pumping the quantum dot.

10. The nano-colonnade VCSEL device of claim 1, further comprising a quantum dot integrated in the nanowire column spaced from and between the distributed Bragg mirrors.

11. The nano-colonnade VCSEL device of claim 1, further comprising an electrical pump to facilitate pumping a laser cavity that is formed by the nanowire column and the distributed Bragg mirrors.

12. The nano-colonnade VCSEL device of claim 11, wherein the electrical pump comprises two or more of the first layer being highly doped, the second layer being highly doped, an electrically conductive contact pad on the (111) horizontal surface and an electrically conductive contact pad on a surface of the second layer opposite the facing surface in a combination that facilitates an electrical connection to the opposite ends of the laser cavity, the electrical connection supporting one or both of an electrical current and an electrical pulse.

13. The nano-colonnade VCSEL device of claim 1, further comprising an optical pump integrated on the first layer to pump a laser cavity formed by the nanowire column and the distributed Bragg mirrors.

14. The nano-colonnade VCSEL device of claim 1, wherein the nanowire column is lattice-matched to one or more of the first layer, the second layer, the insulator support and the distributed Bragg mirrors.

15. The nano-colonnade VCSEL device of claim 1, wherein the first layer is a semiconductor material having a [111]crystal orientation, the second layer being a semiconductor material having any crystal orientation.

16. The nano-colonnade VCSEL device of claim 1, further comprising:
a first contact pad on the (111) horizontal surface of the first layer, the first contact pad being out from under the overhanging portion and being spaced from the nanowire column; and
a second contact pad on a horizontal surface of the second layer opposite the facing horizontal surface, the first contact pad and the second contact pad being electrically conductive.

17. The nano-colonnade VCSEL device of claim 1, wherein the first layer is a semiconductor layer of a semiconductor-on-insulator wafer.

18. The nano-colonnade VCSEL device of claim 1, wherein the second layer overhangs the insulator support on opposite sides of the insulator support to form back-to-back overhanging portions, and wherein the nanowire column extends from the (111) horizontal surface to the facing horizontal surface in each overhanging portion.

19. The nano-colonnade VCSEL device of claim 18, wherein the distributed Bragg mirrors are integrated into the nanowire columns, a first Bragg mirror being adjacent to a first end of the nanowire columns that is adjacent to the (111) horizontal surface, a second Bragg mirror being adjacent to a second end of the nanowire columns that is adjacent to the facing horizontal surface of the overhanging portions.

20. The nano-colonnade VCSEL device of claim 18, further comprising first contact pads on the (111) horizontal surface of the first layer and a second contact pad on the second layer, the first contact pads being out from under the overhanging portions and spaced from the nanowire columns, the second contact pad being on a horizontal surface of the second layer that is opposite the facing horizontal surface, the second contact pad overlying the insulator support between the overhanging portions, the first contact pads and the second contact pad being electrically conductive.

21. The nano-colonnade VCSEL device of claim 1, wherein the second layer with the overhanging portion and the insulator support form a first section, the nano-colonnade VCSEL device further comprising a second section that is a mirror image of the first section on the first layer, the second section comprising a mirror image second layer having an overhanging portion, a mirror image insulator support, and another nanowire column extending from the first layer to the mirror image second layer, the second section facing the first section and being spaced from the first section, such that the respective overhanging portions are separated by a gap.

22. The nano-colonnade VCSEL device of claim 1, wherein the second layer with the overhanging portion is partitioned into physically separated segments to form an array of nano-VCSEL devices, a nano-VCSEL device of the array comprising a different segment of the second layer having a respective overhanging portion, the first layer, the insulator support between the first layer and the segment, and a nanowire column extending from the first layer to the respective overhanging portion of the second layer segment, the nano-VCSEL devices of the array being separately addressable.

23. The nano-colonnade VCSEL device of claim 22, wherein the second layer segments and the insulator support of the array form a first section, the nano-colonnade VCSEL device further comprising a second section that is a mirror image of the first section on the first layer, the second section comprising mirror image second layer segments having respective overhanging portions, a mirror image insulator support, and nanowire columns extending from the first layer to the mirror image second layer segments of the array, the second section facing the first section and being spaced from the first section, such that the respective overhanging portions are separated by a gap.

24. The nano-colonnade VCSEL device of claim 1 used in a display, the display comprising a plurality of the VCSEL devices grouped together, such that an emission from a VCSEL device of the plurality stimulates an emission from a proximate VCSEL device of the plurality to produce a brighter light from the grouped plurality than the plurality of VCSEL devices without proximate stimulation.

25. The nano-colonnade VCSEL device of claim 1 used in a display comprising a plurality of the nanowire columns in proximity to each other, such that an emission from a nanowire column of the plurality stimulates an emission from a proximate nanowire column of the plurality to produce a brighter light from the plurality than the plurality of nanowire columns without proximate stimulation.

26. The nano-colonnade VCSEL device of claim 1 used in an optical amplifier, the optical amplifier comprising a semiconductor optical amplifier (SOA) in proximity to the VCSEL device, such that an emission from the VCSEL device interacts with an active material of the SOA to enhance an amplification of light by the SOA.

27. The nano-colonnade VCSEL device of claim 1, wherein a molecule of a foreign substance in proximity to the nanowire column alters an emission from the VCSEL device, the altered emission being detectable, such that the VCSEL device is a single molecule detector.

28. The nano-colonnade VCSEL device of claim 1 used in a display light source, the display light source comprising a white light emitting material in proximity to the VCSEL device, such that an emission from the VCSEL device stimulates the material to produce a brighter white light than the material produces without the VCSEL device stimulation, wherein the nanowire column of the VCSEL device comprises a semiconductor material that produces a light emission having a wavelength that is short relative to a wavelength of white light, the short wavelength light emission stimulating the white light emitting material.

29. A nano-colonnade vertical cavity surface emitting laser (VCSEL) array device comprising:
 a first layer having a (111) horizontal surface;
 a second layer;
 an insulator support between the first layer and the second layer that separates the first layer from the second layer, back-to-back portions of the second layer overhanging the insulator support, such that a horizontal surface of the back-to-back overhanging portions is spaced from and faces the (111) horizontal surface of the first layer;
 a nanowire column extending nearly vertically from the (111) horizontal surface to the facing horizontal surface of each overhanging portion; and
 distributed Bragg mirrors adjacent to opposite ends of the nanowire columns.

30. The nano-colonnade VCSEL array device of claim 29, wherein the distributed Bragg mirrors comprises a first set of Bragg reflector layers and a second set of Bragg reflector layers, the first set being integrated into either the first layer or the nanowire column adjacent to the (111) horizontal surface, the second set being integrated into either the second layer or the nanowire column adjacent to the facing horizontal surface, such that the first set of Bragg reflector layers and the second set of Bragg reflector layers delineate a vertical optical cavity with the nanowire column.

31. The nano-colonnade VCSEL array device of claim 29, further comprising first contact pads on the (111) horizontal surface of the first layer and a second contact pad on the second layer, the first contact pads being located out from under the overhanging portions and spaced from the nanowire columns, the second contact pad being on a horizontal surface of the second layer that is opposite the facing horizontal surface, the second contact pad overlying the insulator support between the overhanging portions, the first contact pads and the second contact pad being electrically conductive.

32. A nano-colonnade vertical cavity surface emitting laser (VCSEL) device with an integral pump comprising:
 a first layer having a (111) horizontal surface;
 a second layer;
 an insulator support between the first layer and the second layer that separates the first layer from the second layer, a portion of the second layer overhanging the insulator support, such that a horizontal surface of the overhanging portion is spaced from and faces the (111) horizontal surface of the first layer;
 a nanowire column extending nearly vertically from the (111) horizontal surface to the facing horizontal surface of the overhanging portion, the nanowire column comprising a quantum dot;
 distributed Bragg mirrors adjacent to opposite ends of the nanowire column; and
 an optical pump on the first layer, the optical pump having an output directed at the nanowire column, the optical pump optically pumping the quantum dot.

33. The nano-colonnade VCSEL device with an integral pump of claim 32, wherein the distributed Bragg mirrors comprises a first set of Bragg reflector layers and a second set of Bragg reflector layers, the first set being integrated into either the first layer or the nanowire column adjacent to the (111) horizontal surface, the second set being integrated into either the second layer or the nanowire column adjacent to the facing horizontal surface, such that the first set of Bragg reflector layers and the second set of Bragg reflector layers delineate a vertical laser cavity with the nanowire column.

34. The nano-colonnade VCSEL device with an integral pump of claim 32, further comprising electrical connections between the first layer and one or both of the second layer and the optical pump, such that electrical connectivity is established to selectively electrically pump one or both of the quantum dot and the optical pump.

35. The nano-colonnade VCSEL device with an integral pump of claim 32, wherein the optical pump comprises an edge emitting laser formed on or attached to the (111) horizontal surface.

36. A nano-colonnade vertical cavity surface emitting laser (VCSEL) device comprising:
 a first layer having a (111) horizontal surface;
 a second layer;
 an insulator support between the first layer and the second layer that separates the first layer from the second layer, a portion of the second layer overhanging the insulator support, such that a horizontal surface of the overhanging portion is spaced from and faces the (111) horizontal surface of the first layer;
 a nanowire column extending nearly vertically from the (111) horizontal surface to the facing horizontal surface of the overhanging portion; and
 means for delineating a vertical optical cavity with the nanowire column.

37. The nano-colonnade VCSEL device of claim 36, wherein the means for delineating comprises distributed Bragg mirrors adjacent to opposite ends of the nanowire column, the distributed Bragg mirrors comprising a first set of Bragg reflector layers and a second set of Bragg reflector layers, the first set being integrated into either the first layer or the nanowire column adjacent to the (111) horizontal surface, the second set being integrated into either the second layer or the nanowire column adjacent to the facing horizontal surface.

38. A nano-colonnade VCSEL device with an integral pump comprising:
 a first layer having a (111) horizontal surface;
 a second layer;
 an insulator support between the first layer and the second layer that separates the first layer from the second layer, a portion of the second layer overhanging the insulator support, such that a horizontal surface of the overhanging portion is spaced from and faces the (111) horizontal surface of the first layer;

a nanowire column extending nearly vertically from the (111) horizontal surface to the facing horizontal surface of the overhanging portion, the nanowire column comprising means for producing single photon emissions;

distributed Bragg mirrors adjacent to opposite ends of the nanowire column to form a nanowire laser cavity; and means for pumping a laser cavity.

39. The nano-colonnade VCSEL device with an integral pump of claim 38, wherein the means for producing single photon emissions is a quantum dot integrated into the nanowire column, and wherein the means for pumping comprises one or both of means for optically pumping the quantum dot and means for electrically pumping one or both of the nanowire laser cavity and the optical pumping means.

40. The nano-colonnade VCSEL device with an integral pump of claim 38, wherein the means for pumping comprises means for optically pumping on the (111) horizontal surface, the means for optically pumping comprising an edge emitting laser having an output directed at the nanowire laser cavity that optically pumps the means for producing single photon emissions.

41. The nano-colonnade VCSEL device with an integral pump of claim 40, wherein the means for pumping further comprises means for electrically pumping that selectively pumps one or both of a laser cavity of the edge emitting laser and the nanowire laser cavity.

* * * * *

UNITED STATES PATENT AND TRADEMARK OFFICE
CERTIFICATE OF CORRECTION

PATENT NO. : 7,400,665 B2  Page 1 of 1
APPLICATION NO. : 11/084886
DATED : July 15, 2008
INVENTOR(S) : Shih-Yuan Wang, et al.

It is certified that error appears in the above-identified patent and that said Letters Patent is hereby corrected as shown below:

On the face page, in field (73), in "Assignee", in column 1, line 1, delete "Developement" and insert -- Development --, therefor.

In column 26, line 62, in Claim 4, after "column" delete "-".

Signed and Sealed this

Second Day of December, 2008

JON W. DUDAS
*Director of the United States Patent and Trademark Office*